(12) United States Patent
Shin et al.

(10) Patent No.: US 11,393,977 B2
(45) Date of Patent: Jul. 19, 2022

(54) SEMICONDUCTOR DEVICE INCLUDING VERTICAL STRUCTURES AND A METHOD OF MANUFACTURING THE SAME

(71) Applicant: SAMSUNG ELECTRONICS CO., LTD., Suwon-si (KR)

(72) Inventors: Jaeuk Shin, Suwon-si (KR); Youngtak Kim, Hwaseong-si (KR); Sangjine Park, Suwon-si (KR); Hyeyeong Seo, Hwaseong-si (KR); Wonjun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 237 days.

(21) Appl. No.: 16/851,206

(22) Filed: Apr. 17, 2020

(65) Prior Publication Data
US 2021/0066588 A1 Mar. 4, 2021

(30) Foreign Application Priority Data
Aug. 29, 2019 (KR) .................. 10-2019-0106680

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/06* (2013.01); *H01L 45/1253* (2013.01); *H01L 45/1608* (2013.01)

(58) Field of Classification Search
CPC .. H01L 45/06; H01L 45/1233; H01L 27/2463
See application file for complete search history.

(56) References Cited

U.S. PATENT DOCUMENTS

| | | | |
|---|---|---|---|
| 9,153,639 | B2 | 10/2015 | Lee |
| 9,825,048 | B2 | 11/2017 | Cernea |
| 10,121,793 | B2 | 11/2018 | Kim et al. |

(Continued)

FOREIGN PATENT DOCUMENTS

| | | |
|---|---|---|
| CN | 108155185 | 6/2018 |
| CN | 105825313 | 1/2019 |

(Continued)

*Primary Examiner* — Mark V Prenty
(74) *Attorney, Agent, or Firm* — F. Chau & Associates, LLC

(57) ABSTRACT

A semiconductor device is provided including a plurality of first conductive patterns disposed on a substrate. A first insulating pattern is disposed between the plurality of first conductive patterns. A plurality of second conductive patterns is disposed on the plurality of first conductive patterns. A first memory cell structure is disposed between the plurality of first conductive patterns and the plurality of second conductive patterns. A second insulating pattern is disposed on the first insulating pattern and on a side surface of the first memory cell structure. A first vertical structure is disposed on the first insulating pattern and passing through the second insulating pattern to an upper surface of the substrate. The first insulating pattern has a plurality of recess portions. The plurality of recess portions include a first recess portion and a second recess portion. The first recess portion and the second recess portion have different depths.

20 Claims, 28 Drawing Sheets

(56) References Cited

U.S. PATENT DOCUMENTS

| | | |
|---|---|---|
| 11,217,748 B2 * | 1/2022 | Kim ................. H01L 45/06 |
| 2012/0217560 A1 | 8/2012 | Byun et al. |
| 2012/0225530 A1 | 9/2012 | Kim et al. |
| 2014/0138794 A1 | 5/2014 | Yang et al. |
| 2015/0091069 A1 | 4/2015 | Oh et al. |
| 2018/0158829 A1 | 6/2018 | Song et al. |

FOREIGN PATENT DOCUMENTS

| KR | 10-2012-0098127 | 9/2012 |
|---|---|---|
| KR | 10-2912-0100242 | 9/2012 |
| KR | 10-2014-0065186 | 5/2014 |
| KR | 10-2015-0039361 | 4/2015 |

* cited by examiner

SEMICONDUCTOR DEVICE INCLUDING VERTICAL STRUCTURES AND A METHOD OF MANUFACTURING THE SAME

CROSS-REFERENCE TO RELATED APPLICATION

This application claims priority under 35 U.S.C. § 119 to Korean Patent Application No. 10-2019-0106680 filed on Aug. 29, 2019 in the Korean Intellectual Property Office, the disclosure of which is incorporated by reference herein in its entirety.

TECHNICAL FIELD

The present inventive concept relates to a semiconductor device, and more particularly, to a semiconductor device including a vertical structure, and a method of manufacturing the same.

DISCUSSION OF THE RELATED ART

High performance, low power consumption semiconductor devices, such as memory devices are increasingly being developed. For example, next-generation memory devices, such as a phase-change random access memory (PRAM), and a resistive random access memory (RRAM) are being developed. The next-generation memory devices may be formed of a data storage material that may change resistance values according to current or voltage, and may maintain resistance values, even when the supply of current or voltage is interrupted.

However, due to a relatively narrow width of memory cell structures in a PRAM and a relatively low Young's Modulus of germanium-antimony-tellurium (GST), which is used as a data storage pattern material, wiggling, leaning, or collapsing of the pattern during etching or cleaning may occur.

SUMMARY

According to an exemplary embodiment of the present inventive concept, a semiconductor device is provided including a plurality of first conductive patterns disposed on a substrate. A first insulating pattern is disposed between the plurality of first conductive patterns. A plurality of second conductive patterns is disposed on the plurality of first conductive patterns. A first memory cell structure is disposed between the plurality of first conductive patterns and the plurality of second conductive patterns. A second insulating pattern is disposed on the first insulating pattern and on a side surface of the first memory cell structure. A first vertical structure is disposed on the first insulating pattern and passing through the second insulating pattern to an upper surface of the substrate. The first insulating pattern has a plurality of recess portions. The plurality of recess portions include a first recess portion and a second recess portion. The first recess portion and the second recess portion have different depths.

According to an exemplary embodiment of the present inventive concept, a semiconductor device is provided including a plurality of first conductive patterns disposed on a substrate. The plurality of first conductive patterns extend in a first direction. A memory cell structure is disposed on the plurality of first conductive patterns. The memory cell structure includes a switching material pattern and a data storage material pattern. A plurality of second conductive patterns are disposed on the memory cell structure. The plurality of second conductive patterns extend in a second direction. The second direction is perpendicular to the first direction. A first insulating pattern is repeatedly alternately disposed on the substrate with the plurality of first conductive patterns. The first insulating pattern extends in the first direction. A second insulating pattern at least partially surrounds the memory cell structure. The first insulating pattern includes a first recess portion and a second recess portion. The first recess portion and the second recess portion have different widths.

According to an exemplary embodiment of the present inventive concept, a semiconductor device is provided including a plurality of first conductive patterns disposed on a substrate. The plurality of first conductive patterns extend in a first direction. A memory cell structure is disposed on the plurality of first conductive patterns. A plurality of second conductive patterns are disposed on the memory cell structure. The plurality of second conductive patterns extend in a second direction. The second direction is perpendicular to the first direction. The plurality of second conductive patterns intersect the plurality of first conductive patterns. A first insulating pattern is disposed between the plurality of first conductive patterns. A second insulating pattern at least partially surrounds a side surface of the memory cell structure. The first insulating pattern has a plurality of recess portions. A center of each of the plurality of recess portions does not overlap the plurality of second conductive patterns.

BRIEF DESCRIPTION OF THE DRAWINGS

The above and other features of the present inventive concept will be more clearly understood by describing in detail exemplary embodiments thereof taken in conjunction with the accompanying drawings, in which.

DETAILED DESCRIPTION OF THE EMBODIMENTS

First, a semiconductor device according to an exemplary embodiment of the present inventive concept will be described with reference to FIGS. 1A, 1B and IC.

Figure 1A:
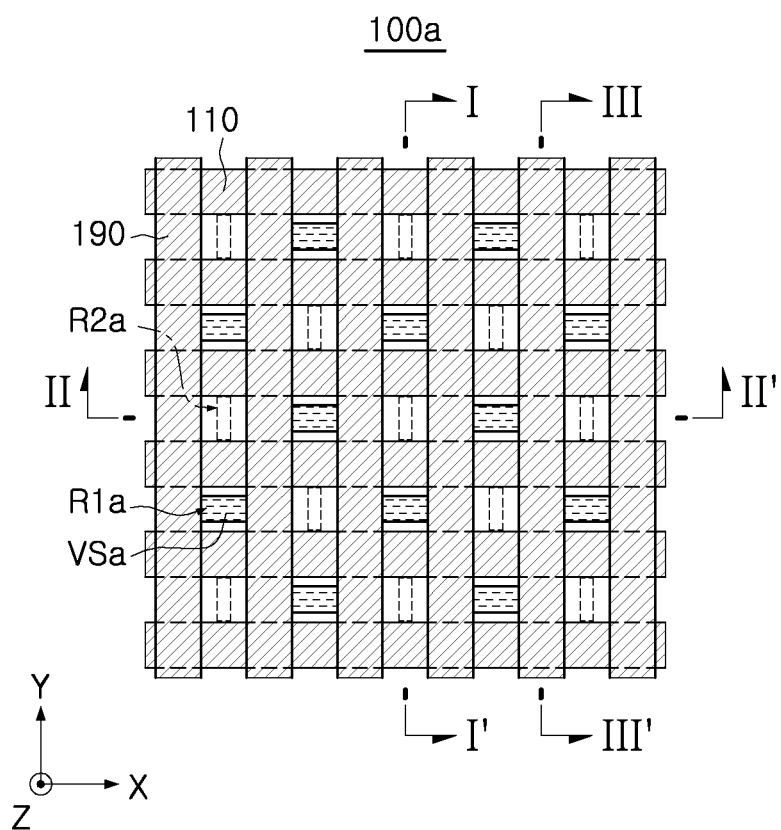
FIG. 1A is a plan view illustrating a semiconductor device according to an exemplary embodiment of the present inventive concept.

FIG. 1A is a plan view illustrating a semiconductor device according to an exemplary embodiment of the present inventive concept. FIG. 1B is a cross-sectional view illustrating a cross-section taken along cross-sectional line I-I' of FIG. 1A and a cross-section taken along cross-sectional line II-II' of FIG. 1A of a semiconductor device according to an exemplary embodiment of the present inventive concept.

Figure 1B:
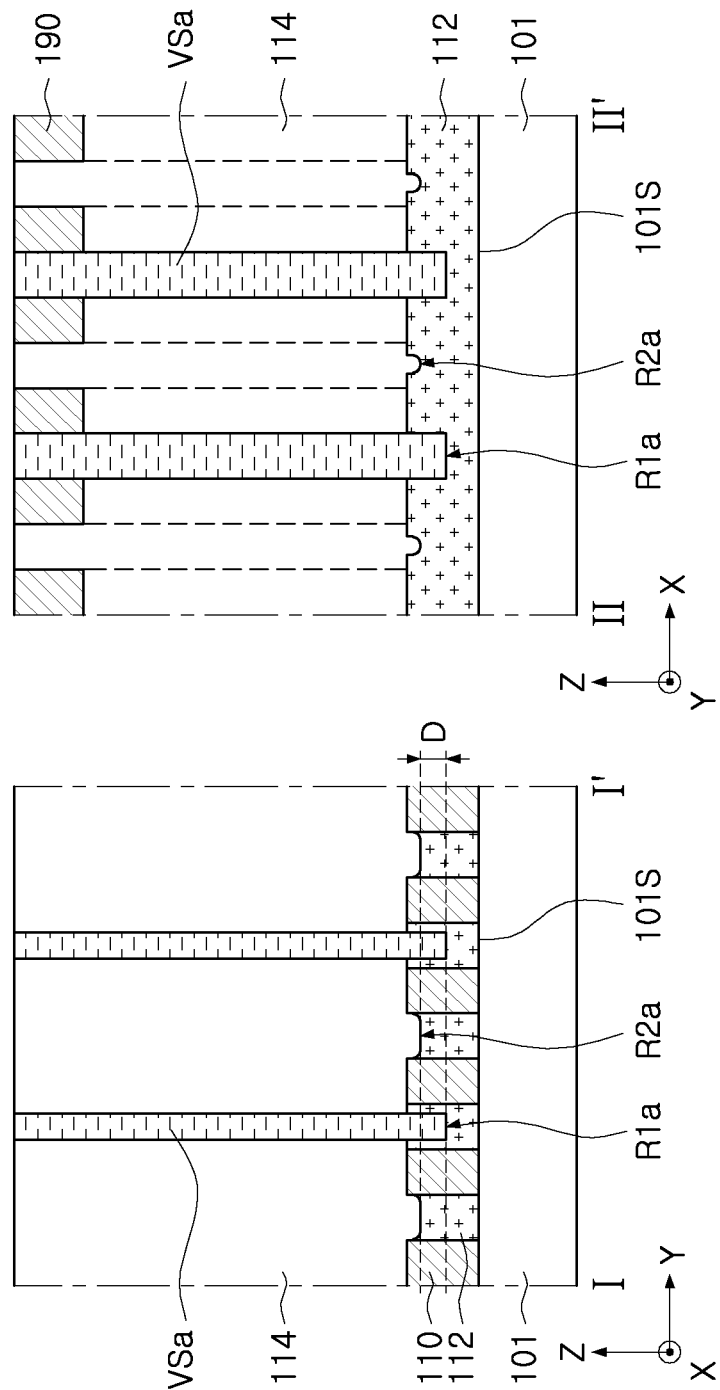
FIGS. 1B and 1C are cross-sectional views illustrating a semiconductor device according to an exemplary embodiment of the present inventive concept.

Referring to FIGS. 1A and 1B, a semiconductor device 100a may include a substrate 101, first conductive patterns 110 on the substrate 101, second conductive patterns 190 on the first conductive patterns 110, a first insulating pattern 112 between the first conductive patterns 110, and a memory cell structure MC (see FIG. 1C) on the first conductive patterns 110.

The substrate 101 may include a semiconductor substrate, and a circuit region on the semiconductor substrate. The semiconductor substrate may be a substrate that may be formed of a semiconductor material such as silicon (Si), or the like. The circuit region may be a region in which a circuit necessary for driving memory cells is located.

The first conductive patterns 110 may be provided in plural. The first conductive patterns 110 may be disposed on the substrate 101 in parallel, and may extend in a first direction (e.g., an x direction). The first conductive patterns 110 may be spaced apart from each other in a second direction (e.g., a y direction).

The second conductive patterns 190 may be provided in plural. The second conductive patterns 190 may be disposed in parallel, and may extend in the second direction (e.g., the y direction), and may be spaced apart from each other in the first direction (e.g., the x direction). The first direction (e.g., the x direction) and the second direction (e.g., the y direction) may be perpendicular to each other, and may be parallel to an upper surface 101S of the substrate 101. In an exemplary embodiment of the present inventive concept, one of the first conductive patterns 110 and the second conductive patterns 190 may be a word line, the other of the first conductive patterns 110 and the second conductive patterns 190 may be a bit line. For example, the first conductive patterns 110 are a word line and the second conductive patterns 190 are a bit line, but the present inventive concept is not limited thereto.

In an exemplary embodiment of the present inventive concept, the first insulating pattern 112 may be disposed on side surfaces of the first conductive patterns 110 extending in the first direction (e.g., the x direction). The first insulating pattern 12 may be disposed between the first conductive patterns 110. For example, the first insulating pattern 112 may be disposed on the substrate 101 and may be repeatedly disposed alternately with the first conductive patterns 110. The first insulating pattern 12 may have a linear shape extending in the first direction (e.g., the x direction). The first insulating pattern 112 may be formed of an insulating material such as silicon oxide, silicon nitride, or the like.

The first insulating pattern 112 may include a plurality of recess portions that are recessed from an upper surface of the first insulating pattern 112. The first insulating pattern 112 may be substantially coplanar with an upper surface of the first conductive patterns 110. A center of each of the plurality of recess portions may not overlap the second conductive patterns 190. The first insulating pattern 112 may include first and second recess portions R1a and R2a, which are adjacent to the first conductive patterns HO. The first and second recess portions R1a and R2a may have different widths, and may be, disposed in a region in which the first and second conductive patterns 110 and 190 do not overlap each other. The first and second recess portions R1a and R2a may be alternately disposed in a hash shaped space formed between neighboring first conductive patterns 110, extending in parallel, that intersect neighboring second conductive patterns 190, extending in parallel. For example, a vertical structure VSa and a second insulating pattern 114 may be disposed in the interior of the hash shaped space in which the second insulating pattern 114 at least partially surrounds sidewalls of the vertical structure VSa. The vertical structure VSa may have parallel short sides extending in the second direction (e.g., the y direction) that are in contact with the neighboring second conductive patterns 190, and the vertical structure VSa may, have parallel long sides extending in the first direction (e.g., die x direction) in contact with the first insulating pattern 112 between neighboring first conductive patterns 110. The second insulating pattern 114 may be disposed between sidewalls of long sides of the vertical structure VSa and the neighboring conductive patterns 110, The first and second recess portions R1a and R2a may be repeatedly arranged alternately in the first direction (e.g., the x direction) and the second direction (e.g., the y direction). For example, the first recess portion R1a and the second recess portion R2a may be repeatedly arranged alternately between neighboring first conductive patterns 110 in the first direction (e.g., the x direction). However, the arrangement of the first and second recess portions R1a and R2a is not limited to that illustrated in FIG. 1A, and may be variously changed.

The first recess portion R1a may be disposed between the first conductive patterns 110, and the insulating pattern 112 may be partially disposed between the first recess portion R1a and the first conductive patterns 110. A region in which the first insulating pattern 112 is not recessed may exist on a side surface of the first recess portion R1a. For example, the first recess portion R1a may be formed between non-recessed portions of the first insulating pattern 112 formed on adjacent sidewalls of neighboring first conductive patterns 110. A lower end of the first recess portion R1a may be provided between upper and lower surfaces of the first conductive patterns 110. The first recess portion R1a may have a shape in which a width thereof narrows (e.g., tapers) in a third direction (e.g., a z direction) towards the substrate 101, but the present inventive concept is not limited thereto. A width of the first recess portion R1a in the first direction (e.g., the x direction) may be greater than a width of the first recess portion R1a in the second direction (e.g., the y direction).

The second recess portion R2a may be disposed between the first conductive patterns 110, and may be adjacent to the side surfaces of the first conductive patterns 110. A maximum width of the second recess portion R2a between neighboring first conductive patterns 110 may be substantially equal to a distance between the first conductive patterns 110. A lower end of the second recess portion R2a may be provided between the upper and lower surfaces of the first conductive patterns 110. The second recess portion R2a may have a shape in which the width thereof narrows in the third direction (e.g., the z direction) towards the substrate 101. The first recess portion R1a and the second recess portion R2a may have different depths. For example, a depth of the first recess portion R1a may be deeper than a depth of the second recess portion R2a. In other words, the first recess portion R1a and the second recess portion R2a may have lower ends having different heights. For example, the lower end of the first recess portion R1a may be lower than the lower end of the second recess portion R2a. The lower end of the first recess portion R1a may be located lower than the lower end of the second recess portion R2a by a spaced distance D. The distance D may refer to a distance in the third direction (e.g., the z direction). A width of the second recess portion R2a in the first direction (e.g., the x direction) may be smaller than a width of the second recess portion R2a in the second direction (e.g., the y direction).

In an exemplary embodiment of the present inventive concept, the semiconductor device 100a may further include a second insulating pattern 114 on the first conductive patterns 110 and the first insulating pattern 12. The second insulating pattern 114 may be disposed on the first insulating pattern 112, and may fill the second recess portion R2a. The second insulating pattern 114 may be formed of an insulating material such as silicon oxide, silicon nitride, or the like.

In an exemplary embodiment of the present inventive concept, the semiconductor device 100a may further include the vertical structure VSa on the first insulating pattern 112 and passing through the second insulating pattern 114 in the third direction (e.g., the z direction) perpendicular to the upper surface 101S of the substrate 101. The vertical structure VSa may be disposed in a region in which the first and second conductive patterns 110 and 190 do not overlap each other. The vertical structure VSa may be disposed on the first recess portion R1a, and a lower portion of the vertical structure VSa may be disposed in the first recess portion R1a. The second recess portion R2a may be a region in which the vertical structure VSa is not disposed. The vertical structure VSa may extend from the first recess portion R1a to side surfaces of the second conductive patterns 190 in the third direction (e.g., the z direction). Side surfaces of an upper portion of the vertical structure VSa may be substantially coplanar with the side surfaces of the second conductive patterns 190. The vertical structure VSa may have a shape that narrows in the third direction (e.g., the z direction) from an upper portion thereof to the lower portion thereof, and a width of the lower portion of the vertical structure VSa may be smaller than a width of the upper portion of the vertical structure VSa. The width of the lower portion of the vertical structure VSa in the second direction (e.g., the y direction) may be less than the distance between the first conductive patterns 110. The vertical structure VSa may be formed of an insulating material such as silicon oxide, silicon nitride, or the like. The vertical structure VSa may include a material having a different etch selectivity with respect to a material forming the second insulating pattern 114.

The lower portion of the vertical structure VSa may be disposed in the first insulating pattern 112. The vertical structure VSa may be disposed on side surfaces of the second insulating pattern 114 at least partially surrounding the memory cell structure MC (shown in FIG. 1C). The upper portion of the vertical structure VSa may be disposed on the side surfaces of the second conductive patterns 190 on the memory cell structure MC. Therefore, the vertical structure VSa may serve as a support for fixing structures between the first conductive patterns 110 and the second conductive patterns 190. As a result, the vertical structure VSa may serve as a support for preventing defects in which the memory cell structure MC is inclined, is in contact with an adjacent memory cell structure MC, or is collapsed.

Figure 1C:
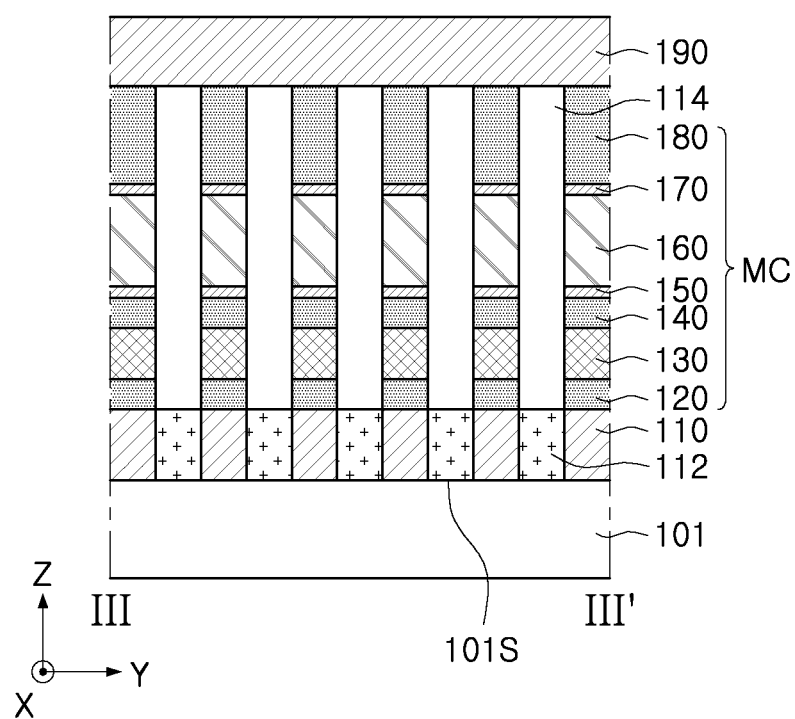

FIG. 1C is a cross-sectional view illustrating a cross-section taken along cross-sectional line III-III' of FIG. 1A, to illustrate a semiconductor device according to an exemplary embodiment of the present inventive concept.

Referring to FIG. 1C, the semiconductor device 100a may include the memory cell structure MC between the first conductive patterns 110 and the second conductive patterns 190. The memory cell structure MC may be arranged in the second direction (e.g., the y direction) underneath the second conductive patterns 190.

In an exemplary embodiment of the present inventive concept, the memory cell structure MC may be column shaped. The memory cell structure MC may include a lower conductive pattern 120 on the first conductive patterns 110, a switching material pattern 130 on the lower conductive pattern 120, a middle conductive pattern 140 on the switching material pattern 130, a lower electrode pattern 150 on the middle conductive pattern 140, a data storage material pattern 160 on the lower electrode pattern 150, an upper electrode pattern 170 on the data storage material pattern 160, and an upper conductive pattern 180 on the upper electrode pattern 170. The memory cell structure MC may be a structure in which a plurality of patterns, having central portions consistent with each other in the third direction (e.g., the z direction), are stacked. For example, a virtual line passing through a central portion of an upper surface of the data storage material pattern 160 may correspond to a virtual line passing through a central portion of an upper surface of the switching material pattern 130. In other words, the constituent patterns 120, 130, 140, 150, 160, 170 and 180 of the memory cell structure MC have side surfaces that are aligned in the third direction (e.g., the z direction). When viewed in a plan view, the memory cell structure MC may include, for example, a plurality of patterns, such as patterns having a tetragonal shape, for example, a square, a rectangle, or the like, a circular shape, or the like.

The lower conductive pattern 120 may be disposed between the first conductive patterns 110 and the switching material pattern 130 in the third direction (e.g., the z direction). The lower conductive pattern 120 may also be disposed between lower portions of the second insulating patterns 114 and may overlap therewith in the second direction (e.g., the y direction). The switching material pattern 130 may be disposed between the lower conductive pattern 120 and the middle conductive pattern 140. The middle conductive pattern 140 may be disposed between the switching material pattern 130 and the lower electrode pattern 150. The lower electrode pattern 150 may be disposed between the middle conductive pattern 140 and the data storage material pattern 160. The data storage material pattern 160 may be disposed between the lower electrode pattern 150 and the upper electrode pattern 170. The upper electrode pattern 170 may be disposed between the data storage material pattern 160 and the upper conductive pattern 180.

In an exemplary embodiment of the present inventive concept, the lower conductive pattern 120, the switching material pattern 130, the middle conductive pattern 140, the lower electrode pattern 150, the data storage material pattern 160, the upper electrode pattern 170, and the upper conductive pattern 180 may have inclined side surfaces in which upper widths thereof are smaller than lower widths thereof according to an aspect ratio, respectively, but the present inventive concept is not limited thereto.

In an exemplary embodiment of the present inventive concept, the data storage material pattern 160 may include an upper region adjacent to an interface between the data storage material pattern 160 and the upper electrode pattern 170, a lower region adjacent to an interface between the data storage material pattern 160 and the lower electrode pattern 150, and a middle region between the upper region and the lower region. The data storage material pattern 160 may have a shape in which a width of the upper region and a width of the lower region may be greater than a width of the middle region in the first direction (e.g., the x direction) and/or the second direction (e.g., the y direction). For example, the data storage material pattern 160 may be partially recessed from a side surface thereof in a medial direction, to have a concave shape medially in the middle region, but the present inventive concept is not limited thereto.

The memory cell structure MC may have a structure at least partially surrounded by the second insulating pattern 114. As illustrated in FIG. 1C, the second insulating pattern 114 may be disposed on side surfaces of the memory cell structure MC in the second direction (e.g., the y direction). The second insulating pattern 114 may be disposed on the side surfaces of the memory cell structure MC in the first direction (e.g., the x direction). Therefore, the second insulating pattern 114 may at least partially surround the memory cell structure MC.

In an exemplary embodiment of the present inventive concept, spacers may be arranged to cover the side surfaces of the memory cell structure MC. The spacers may be formed as a plurality of layers. For example, the spacers may include a first spacer and/or a second spacer. The first spacer may be disposed on a side surface of the data storage material pattern 160, on a side surface of the upper electrode pattern 170, and on a side surface of the upper conductive pattern 180. The second spacer may cover an outer surface of the first spacer, a side surface of the lower electrode pattern 150, a side surface of the middle conductive pattern 140, a side surface of the switching material pattern 130, and a side surface of the lower conductive pattern 120. The first spacer may extend from an upper surface of the lower electrode pattern 150 toward the second conductive patterns 190 in the third direction (e.g., the z direction), and the second spacer may cover an upper surface of the first insulating pattern 112, and may extend from the upper surface of the first insulating pattern 112 toward the second conductive patterns 190 in the third direction (e.g., the z direction). The spacers may be formed of an insulating material such as silicon oxide, silicon nitride, or the like.

In an exemplary embodiment of the present inventive concept, the lower conductive pattern 120, the switching material pattern 130, and the middle conductive pattern 140 may constitute an ovonic threshold switching device. In an exemplary embodiment of the present inventive concept, the switching material pattern 130 may be formed of a chalcogenide-based ovonic threshold switch material capable of maintaining an amorphous phase during operation of the semiconductor device. For example, the switching material pattern 130 may include an alloy material including at least two or more elements of Arsenic (As), Sulfur (S), Selenium (Se), Tellurium (Te), or germanium (Ge), or additional elements (e.g., an Si, an Nitrogen (N), or the like) that may maintain an amorphous phase in the alloy material at relatively high temperatures. Alternatively, the switching material pattern 130 may be formed of at least one of an alloy material including Te, As, Ge, and Si, an alloy material including Ge, Te, and lead (Pb), an alloy material including Ge, Se, and Te, an alloy material including aluminum (Al), As, and Te, an alloy material including Se, As, Ge, and Si, an alloy material including Se, As, Ge, and C, an alloy material including Se, Te, Ge, and Si, an alloy material including Ge, Sb, Te, and Se, an alloy material including Ge, Bismuth (Bi), Te, and Se, an alloy material including Ge, As, Sb, and Se, an alloy material including Ge, As, Bi, and Te, or an alloy material including Ge, As, Bi, and Se.

The lower conductive pattern 120, the middle conductive pattern 140, and the upper conductive pattern 180 may include a carbon layer, or a material layer including carbon. For example, the material layer including carbon may be a material layer including carbon (C) and a metal element such as tungsten (W) or the like. In an exemplary embodiment of the present inventive concept, the material layer including C may be a material layer including other metal elements, such as titanium (Ti), tantalum (Ta), ruthenium (Ru), etc., in addition to W. In an exemplary embodiment of the present inventive concept, the material layer including C may be a material layer further including an element such as N, boron (B), or the like, in addition to C and the metal element.

In an exemplary embodiment of the present inventive concept, the data storage material pattern 160 may be formed of a chalcogenide-based phase change memory material, capable of phase change from a high specific resistance amorphous phase to a low specific resistance crystal phase or capable of phase change from the crystal phase to the amorphous phase, according to temperature and time heated by applied current. For example, the data storage material pattern 160 may be a phase change memory material such as a chalcogenide material including Ge, Sb, and/or Te, or the like. Alternatively, the data storage material pattern 160 may be a phase change memory material including at least one element of Te or Se, and at least one element of Ge, Antimony (Sb), Bi, Pb, Tin (Sn), As, S, Si, Phosphorus (P), Oxygen (O), N, or Indium (In). In an exemplary embodiment of the present inventive concept, the data storage material pattern 160 may be formed by being replaced with a data storage material capable of storing information in another manner, instead of the phase change memory material.

The lower electrode pattern 150 and the upper electrode pattern 170 may be formed of a conductive material such as tungsten, or the like. The lower electrode pattern 150 and the upper electrode pattern 170 may be formed of a conductive material including Zr (Zirconium), Molybdenum (Mo), W, TiN, TiAlN, TaN, WN, MoN, TiSiN, TiCN, TiBN, ZrSiN, WSiN, WBN, ZrAlN, MoAlN, TaSiN, TaAlN, TiON, TiAlON, WON, TaON, or a combination thereof.

According to exemplary embodiments of the present inventive concept, semiconductor devices will be described with reference to FIGS. 2A, 2B, 3A, 3B, 4A, 4B, 5A, 5B, 6A and 6B. Like reference numerals may refer to previously described like elements.

Figure 2A:
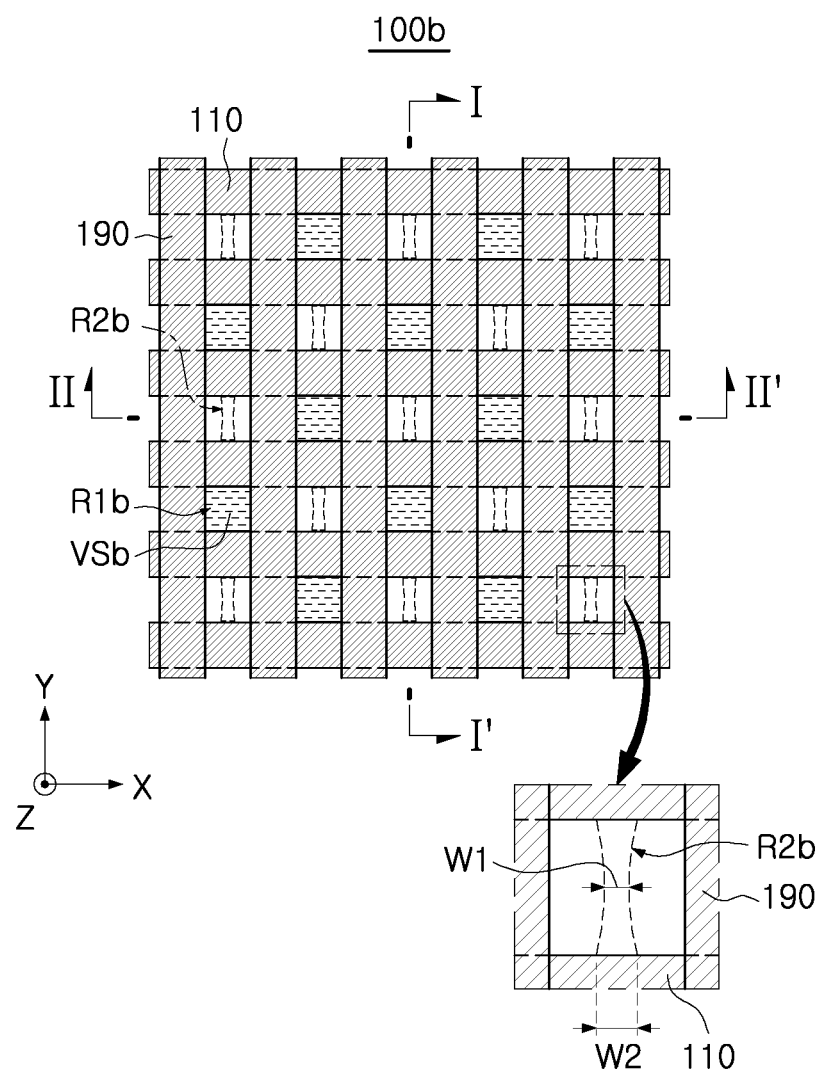
FIGS. 2A and 2B are a plan and a cross-sectional view, respectively, illustrating a semiconductor device according to an exemplary embodiment of the present inventive concept.
Figure 2B:
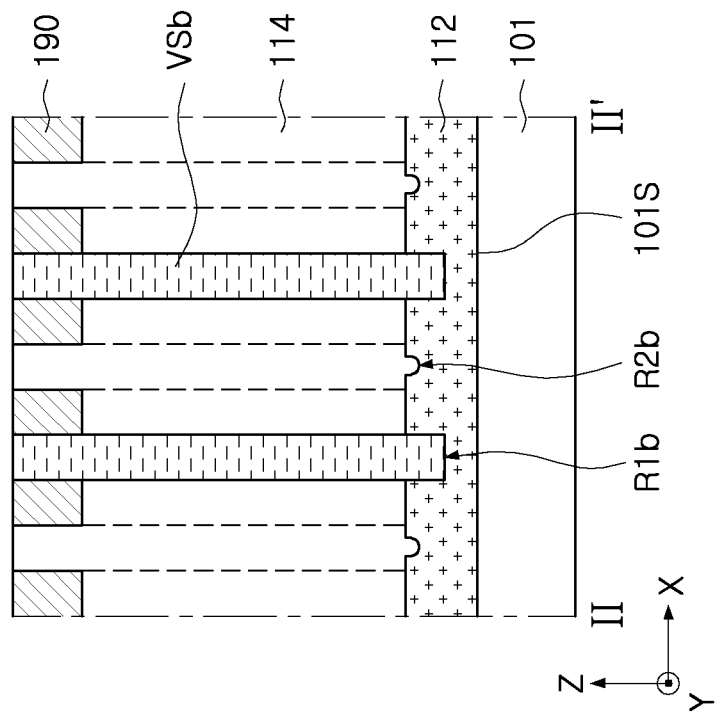
Figure 2B:
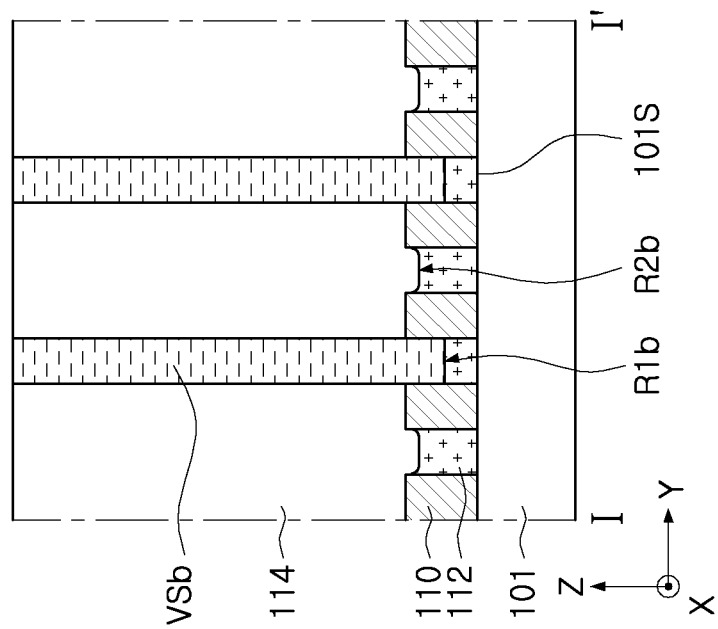

FIG. 2A is a plan view illustrating a semiconductor device according to an exemplary embodiment of the present inventive concept, and FIG. 2B is a cross-sectional view illustrating a cross-section taken along cross-sectional line I-I' of FIG. 2A and a cross-section taken along cross-sectional line II-II' of FIG. 2A, to illustrate a semiconductor device according to an exemplary embodiment of the present inventive concept.

Referring to FIGS. 2A and 2B, a semiconductor device 100b may include first conductive patterns 110, second conductive patterns 190, a first insulating pattern 112 including a first recess portion R1b and a second recess portion R2b in a region in which the first conductive patterns 110 and the second conductive patterns 190 are not overlapped, a vertical structure VSb, and a memory cell structure MC.

In an exemplary embodiment of the present inventive concept, a width of the first recess portion R1b in the first direction (e.g., the x direction) may be substantially equal to a width of the first recess portion R1b in the second direction (e.g., the y direction). The first recess portion R1b may have a square shape when viewed in a plan view, for example.

In an exemplary embodiment of the present inventive concept, referring to the enlarged partial view of FIG. 2A, a first width W1 of a central portion of the second recess portion R2b in the first direction (e.g., the x direction) may be smaller than a second width W2 of an end of the second recess portion R2b in the first direction (e.g., the x direction), and the end of the second recess portion R2b may be adjacent to the first conductive patterns 110. As illustrated in FIG. 2A, the second recess portion R2b may have a concave lens shape medially recessed in a central portion. A width of the first recess portion R1b in the first direction (e.g., the x direction) may be greater than a width of the second recess portion R2b in the first direction (e.g., the x direction).

In an exemplary embodiment of the present inventive concept, the vertical structure VSb passing through a second insulating pattern 114 may be disposed on the first insulating pattern 112. The vertical structure VSb may be disposed on the first recess portion R1b, and may fill the first recess portion R1b. For example, the vertical structure VSb and the first recess portion R1b may substantially fill the entire hash shaped area. The vertical structure VSb may extend to side surfaces of the second conductive patterns 190, and an upper portion of the vertical structure VSb may contact the side surfaces of the second conductive patterns 190. A width of the vertical structure VSb in the first direction (e.g., the x direction) may be substantially equal to a width of the vertical structure VSb in the second direction (e.g., the y direction). A width of a lower region of the vertical structure VSb in the second direction (e.g., the y direction) may be substantially equal to a distance between the first conductive patterns 110.

Figure 3A:
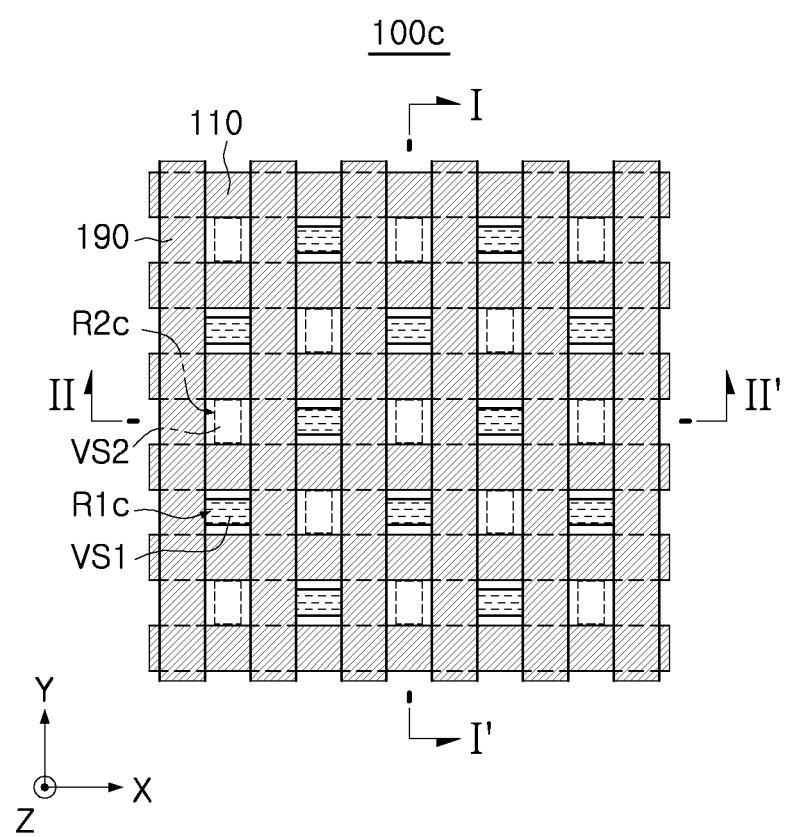
FIGS. 3A and 3B are a plan and a cross-sectional view, respectively, illustrating a semiconductor device according to an exemplary embodiment of the present inventive concept.
Figure 3B:
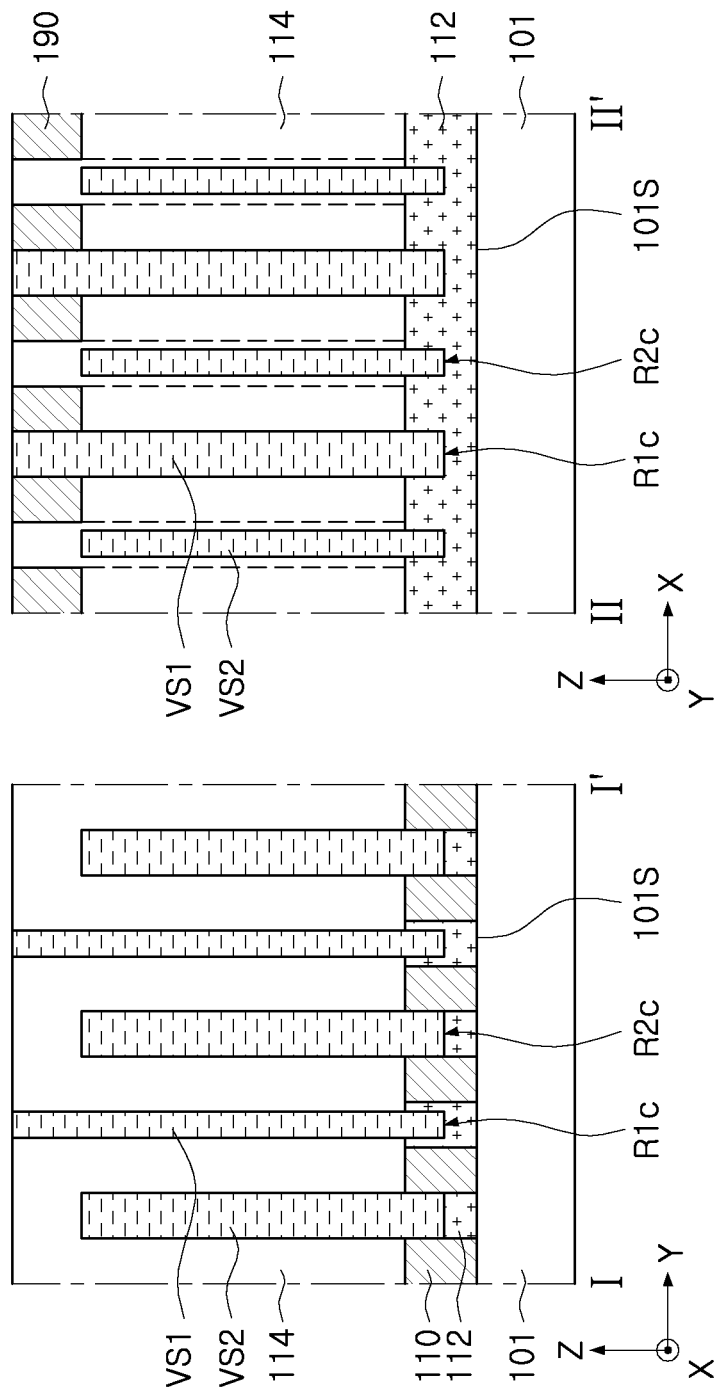

FIG. 3A is a plan view illustrating a semiconductor device according to an exemplary embodiment of the present inventive concept, and FIG. 3B is a cross-sectional view illustrating a cross-section taken along cross-sectional line I-I' of FIG. 3A and a cross-section taken along cross-sectional line II-II' of FIG. 3A, to illustrate a semiconductor device according to an exemplary embodiment of the present inventive concept.

Referring to FIGS. 3A and 3B, a semiconductor device 100c may include first conductive patterns 110, second conductive patterns 190, a first insulating pattern 112 including a first recess portion R1c and a second recess portion R2c in a region in which the first conductive patterns 110 and the second conductive patterns 190 are not overlapped, vertical structures VS1 and VS2, and a memory cell structure MC.

In an exemplary embodiment of the present inventive concept, a width of the first recess portion R1c in the first direction (e.g., the x direction) may be greater than a width of the first recess portion R1c in the second direction (e.g., the y direction), and a width of second recess portion R2c in the first direction (e.g., the x direction) may be smaller than a width of the second recess portion R2c in the second direction (e.g., the y direction).

In an exemplary embodiment of the present inventive concept, the vertical structures VS1 and VS2 may include a first vertical structure VS1 passing through a second insulating pattern 114 on the first insulating pattern 112 and disposed on the first recess portion R1c, and a second vertical structure VS2 disposed on the second recess portion R2c. A width of a lower portion of each of the first and second vertical structures VS1 and VS2 may be smaller than a width of an upper portion of each of the first and second vertical structures VS1 and VS2. An upper surface of the first vertical structure VS1 may be located higher than an upper surface of the second vertical structure VS2. The upper portion of the first vertical structure VS1 may extend to side surfaces of the second conductive patterns 190, but the upper portion of the second vertical structure VS2 may not extend to side surfaces of the second conductive patterns 190. A width of a lower portion of the first vertical structure VS1 in the second direction (e.g., the y direction) may be smaller than a distance between the first conductive patterns 110. A width of a lower portion of the second vertical structure VS2 in the second direction (e.g., the y direction) may be substantially equal to a distance between the first conductive patterns 110.

The first vertical structure VS1 and the second vertical structure VS2 may be alternately disposed in the hash shaped areas and may have perpendicular extending lengths with respect to one another, in a plan view. For example, the first vertical structures VS1 and the second vertical structures VS2 may have a substantially similar shape in a plan view but may be rotated 90 degrees within respective adjacent hash shaped area. Short sides of the first vertical structure VS1 and the second vertical structure VS2 may contact the second conductive patterns 190 and the first conductive patterns 110, respectively. The second insulating pattern 114 may be disposed in the hash shaped area between long sides of the first vertical structure VS1 and the second vertical structure VS2 and the first conductive patterns 110 and the second conductive patterns 190, respectively.

Figure 4A:
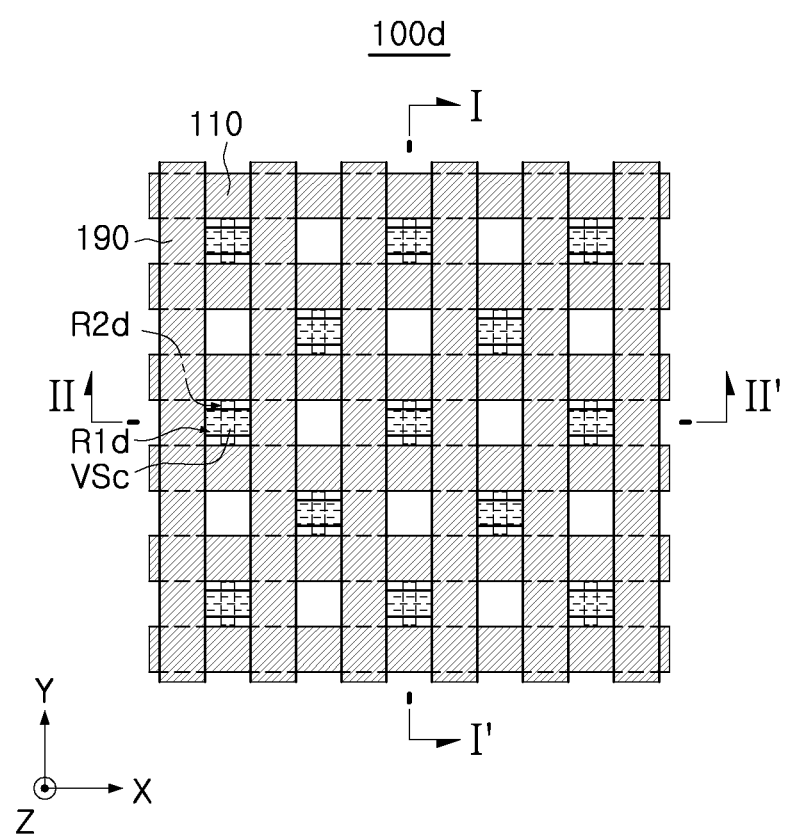
FIGS. 4A and 4B are a plan and a cross-sectional view, respectively, illustrating a semiconductor device according to an exemplary embodiment of the present inventive concept.
Figure 4B:
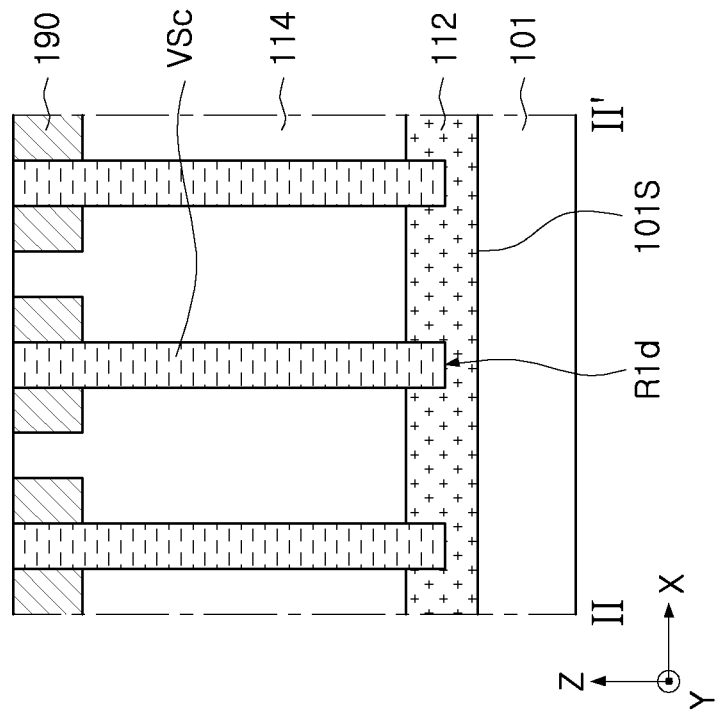
Figure 4B:
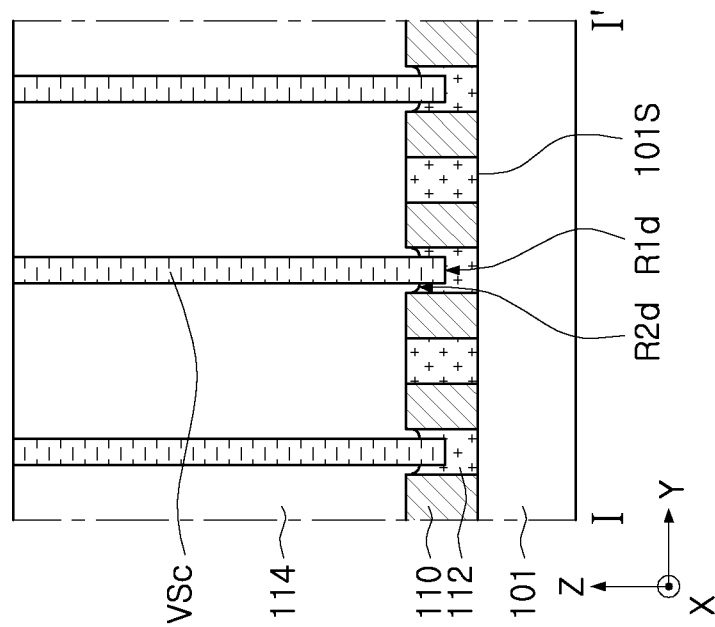

FIG. 4A is a plan view illustrating a semiconductor device according to an exemplary embodiment of the present inventive concept, and FIG. 4B is a cross-sectional view illustrating a cross-section taken along cross-sectional line I-I' of FIG. 4A and a cross-section taken along cross-sectional line II-II' of FIG. 4A, to illustrate a semiconductor device according to an exemplary embodiment of the present inventive concept.

Referring to FIGS. 4A and 4B, a semiconductor device 100d may include first conductive patterns 110, second conductive patterns 190, a first insulating pattern 112 including a first recess portion R1d and a second recess portion R2d in a region in which the first conductive patterns 110 and the second conductive patterns 190 are not overlapped, a vertical structure VSc, and a memory cell structure MC.

In an exemplary embodiment of the present inventive concept, the first recess portion R1d and the second recess portion R2d may overlap each other at right angles, in a plan view. For example, the second recess portion R2d may be disposed at a position in which the first recess portion R1d is disposed. A lower end of the first recess portion R1d may be disposed to be lower than a lower end of the second recess portion R2d.

In an exemplary embodiment of the present inventive concept, the vertical structure VSc passing through the second insulating pattern 114 may be disposed on the first insulating pattern 112. A lower portion of the vertical structure VSc may be disposed in the first recess portion R1d. Since the lower end of the first recess portion R1d may be located lower than the lower end of the second recess portion R2d, the vertical structure VSc may pass through the second recess portion R2d to extend into the first insulating pattern 12 in a lower portion of the second recess portion R2d. The lower end of the vertical structure VSc may be located lower than the lower end of the second recess portion R2d.

According to an exemplary embodiment of the present inventive concept, the overlapped first recess portion R1d and the second recess portion R2d may be alternately disposed in hash shaped areas with areas entirely occupied by the second insulating pattern 14 (e.g., areas devoid of the first recess portion R1d, the vertical structure VSc, and the second recess portion R2d).

Figure 5A:
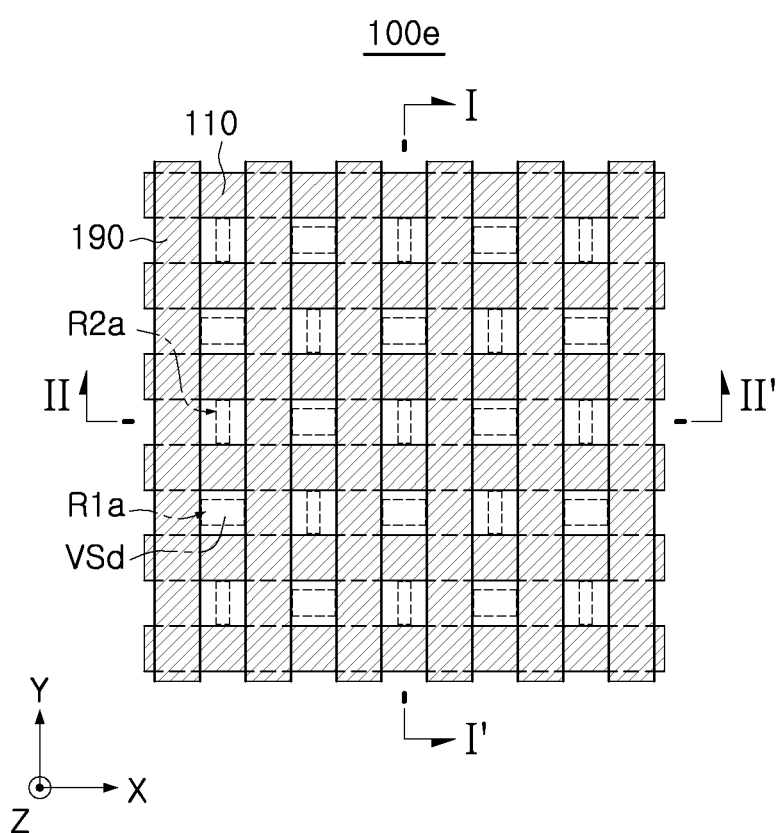
FIGS. 5A and 5B are a plan and a cross-sectional view, respectively, illustrating a semiconductor device according to an embodiment of the present inventive concept.
Figure 5B:
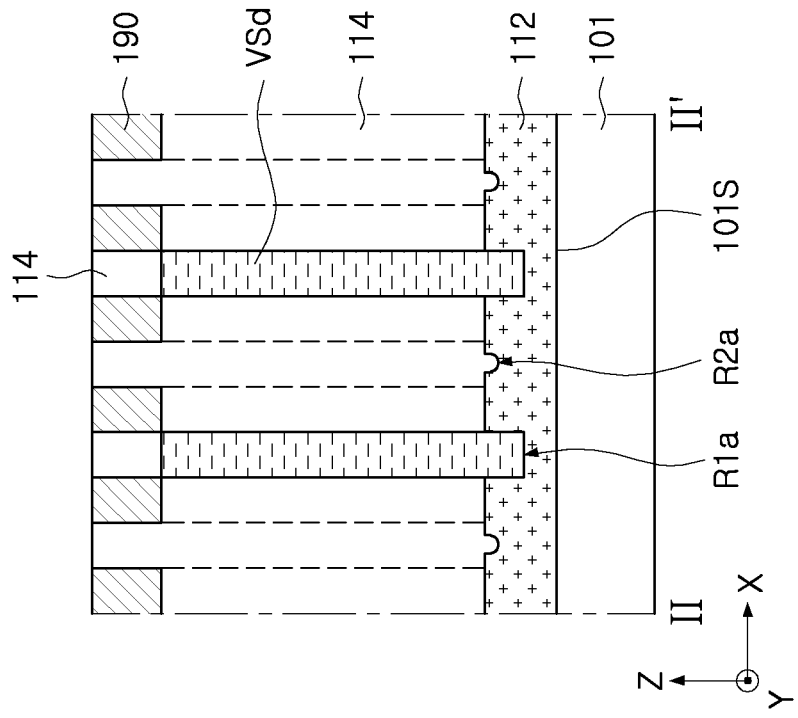
Figure 5B:
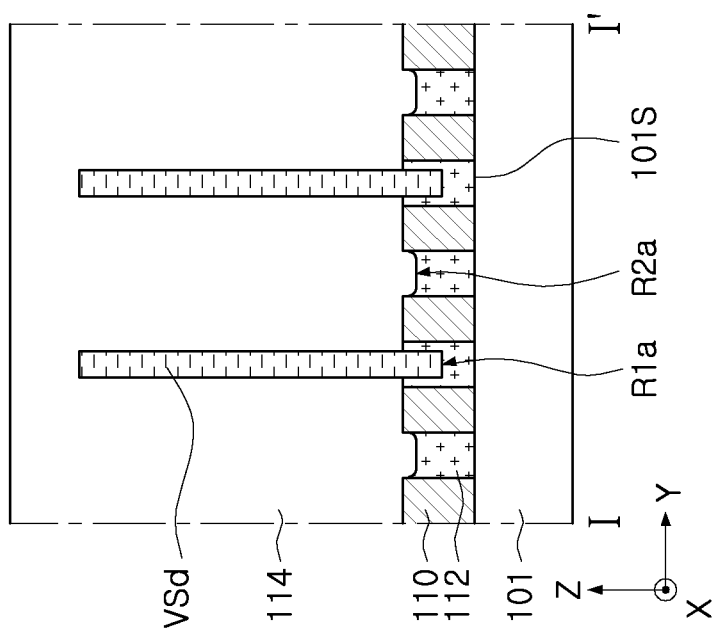

FIG. 5A is a plan view illustrating a semiconductor device according to an exemplary embodiment of the present inventive concept, and FIG. 5B is a cross-sectional view illustrating a cross-section taken along cross-sectional line I-I' of FIG. 5A and a cross-section taken along cross-sectional line II-II' of FIG. 5A, to illustrate a semiconductor device according to an exemplary embodiment of the present inventive concept.

Referring to FIGS. 5A and 5B, a semiconductor device 100e may include first conductive patterns 110, second conductive patterns 190, a first insulating pattern 12 including a first recess portion R1a and a second recess portion R2a in a region in which the first conductive patterns 110 and the second conductive patterns 190 are not overlapped, a vertical structure VSd, and a memory cell structure MC.

In an exemplary embodiment of the present inventive concept, the vertical structure VSd passing through a second insulating pattern 114 may be disposed on the first insulating pattern 112. A lower portion of the vertical structure VSd may be disposed in the first recess portion R1a. An upper surface of the vertical structure VSd may be disposed to be lower than the second conductive patterns 190. The second insulating pattern 112 may cover the lower surface of the vertical structure VSd. The upper surface of the vertical structure VSd may be located on the same level or lower as the lower surfaces of the second conductive patterns 190, but the present inventive concept is not limited thereto.

Figure 6A:
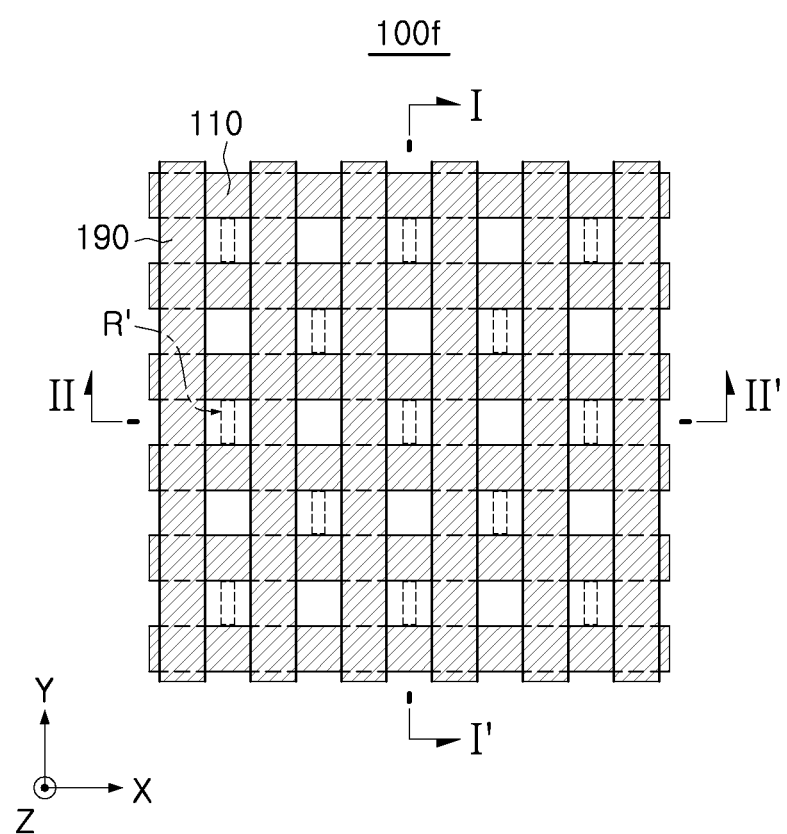
FIGS. 6A and 6B are a plan and a cross-sectional view, respectively, illustrating a semiconductor device according to an exemplary embodiment of the present inventive concept.
Figure 6B:
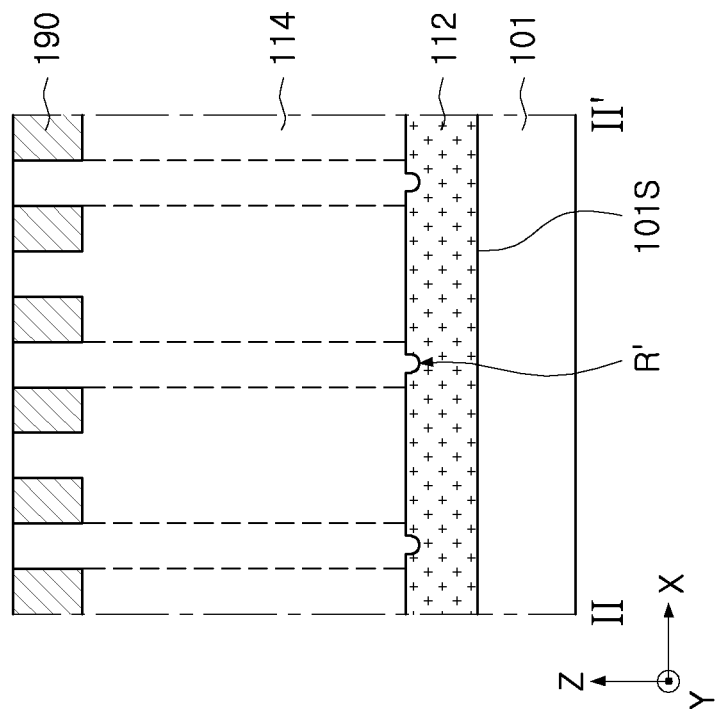
Figure 6B:
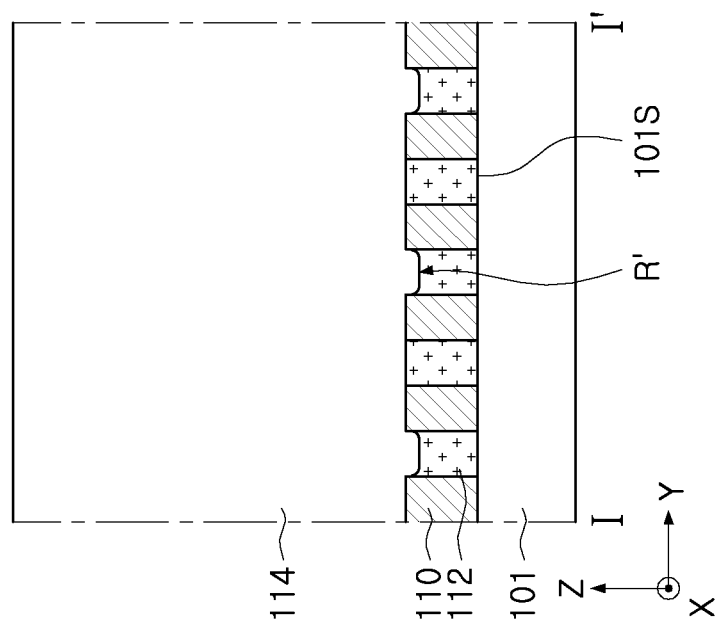

FIG. 6A is a plan view illustrating a semiconductor device according to an exemplary embodiment of the present inventive concept, and FIG. 6B is a cross-sectional view illustrating a cross-section taken along cross-sectional line I-I' of FIG. 6A and a cross-section taken along cross-sectional line II-II' of FIG. 6A, to illustrate a semiconductor device according to an exemplary embodiment of the present inventive concept.

Referring to FIGS. 6A and 6B, a semiconductor device 100f may include first conductive patterns 110, second conductive patterns 190, a first insulating pattern 112 including a plurality of recess portions R' in a region in which the first conductive patterns 110 and the second conductive patterns 190 are not overlapped, and a memory cell structure MC. For example, the recess portions R' may be alternately arranged in the hash shaped areas with regions devoid of the recess portions R'.

In a different manner to the semiconductor devices described with reference to FIGS. 1A, 1B, 2A, 2B, 3A, 3B, 4A, 4B, 5A and 5B, the semiconductor device 100f may not include a vertical structure. The semiconductor device 100f may further include a second insulating pattern 114 on the first conductive patterns 110 and the first insulating pattern 112. The second insulating pattern 114 may be disposed on the plurality of recess portions R', and may fill the plurality of recess portions R'.

In an exemplary embodiment of the present inventive concept, a shape of the plurality of recess portions R' is not limited to that illustrated in FIG. 6A. For example, the plurality of recess portions R' may have the same shape as illustrated in FIG. 2A, or may be variously changed.

Next, referring to FIGS. 7A, 7B and 7C, a structure in which a memory cell structure MC may be stacked in two layers as a semiconductor device according to an exemplary embodiment of the present inventive concept will be described.

Figure 7A:
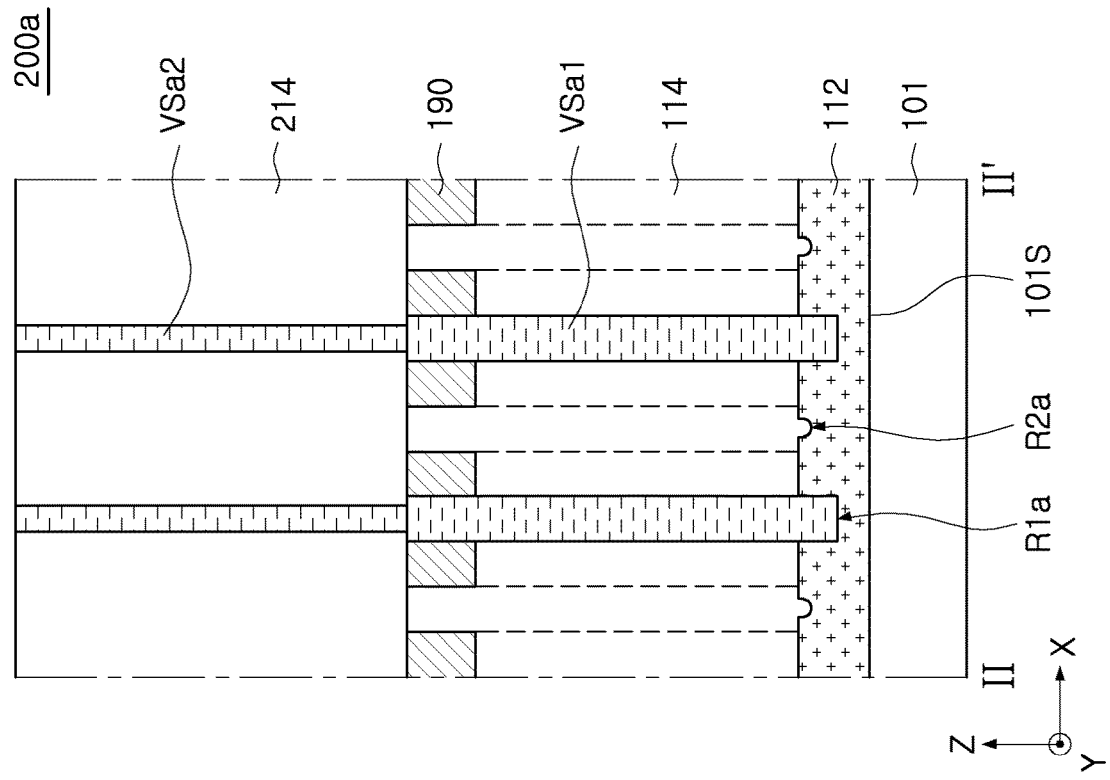
FIGS. 7A, 7B and 7C are cross-sectional views illustrating a semiconductor device according to an exemplary embodiment of the present inventive concept.
Figure 7A:
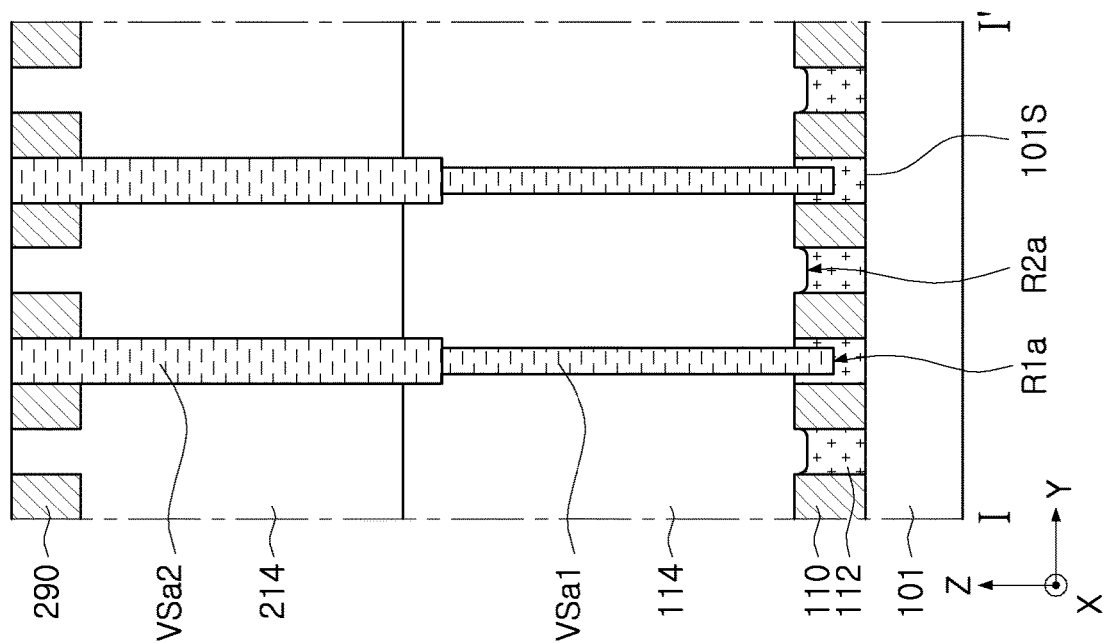
Figure 7B:
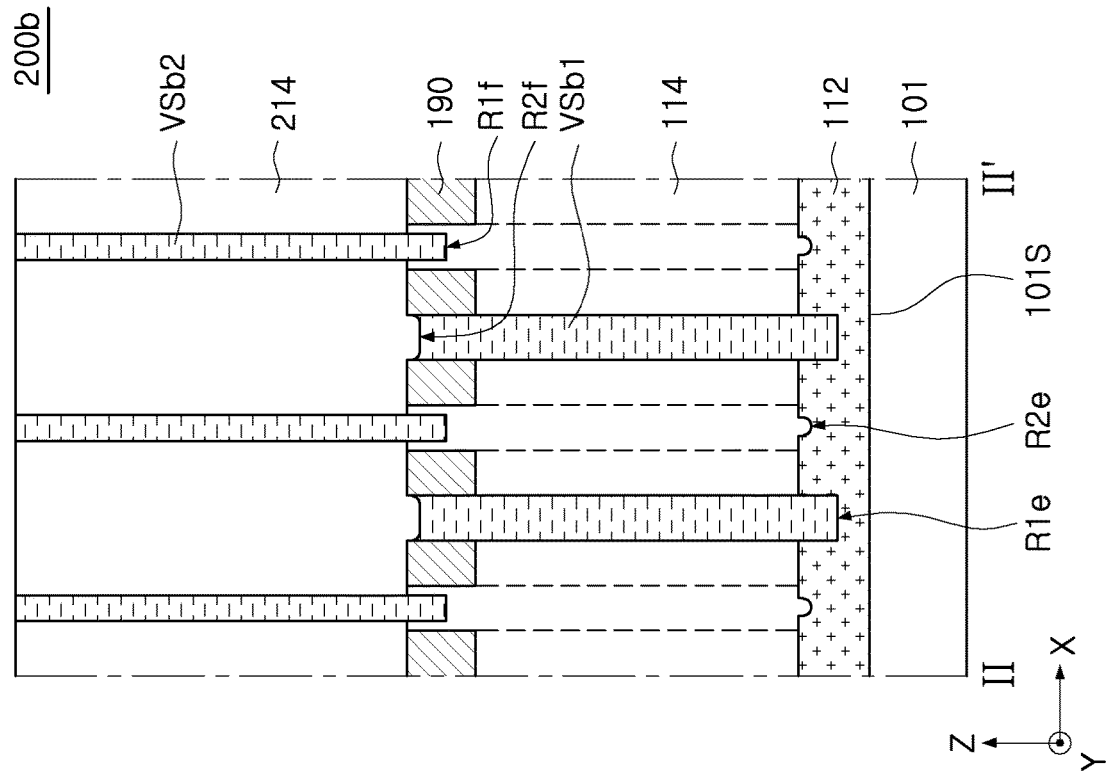
Figure 7B:
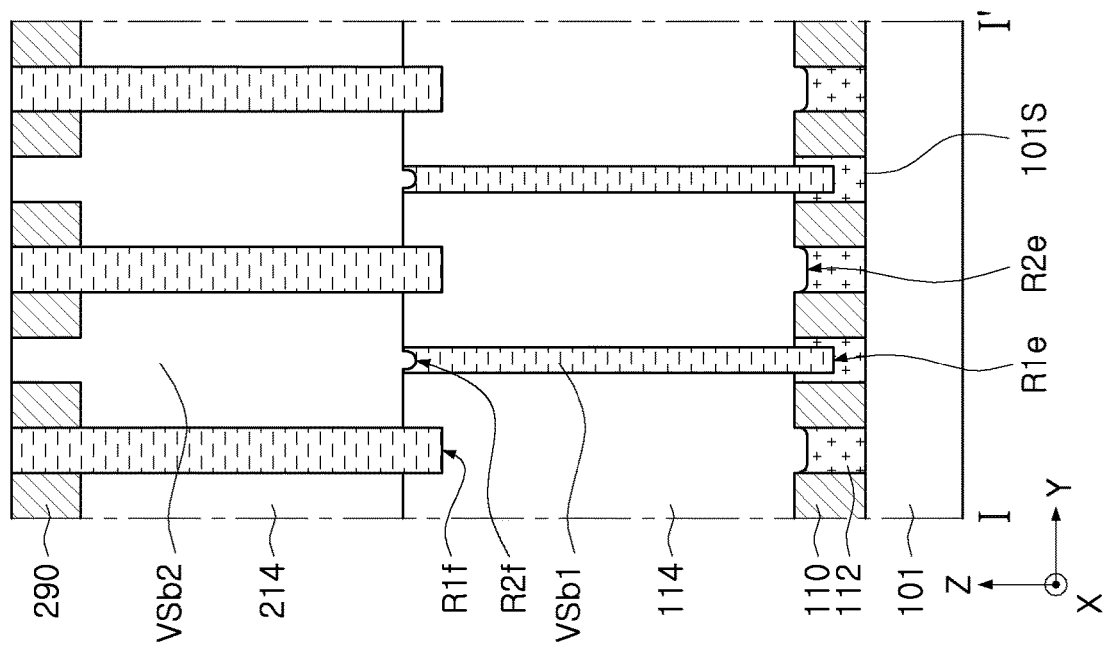
Figure 7C:
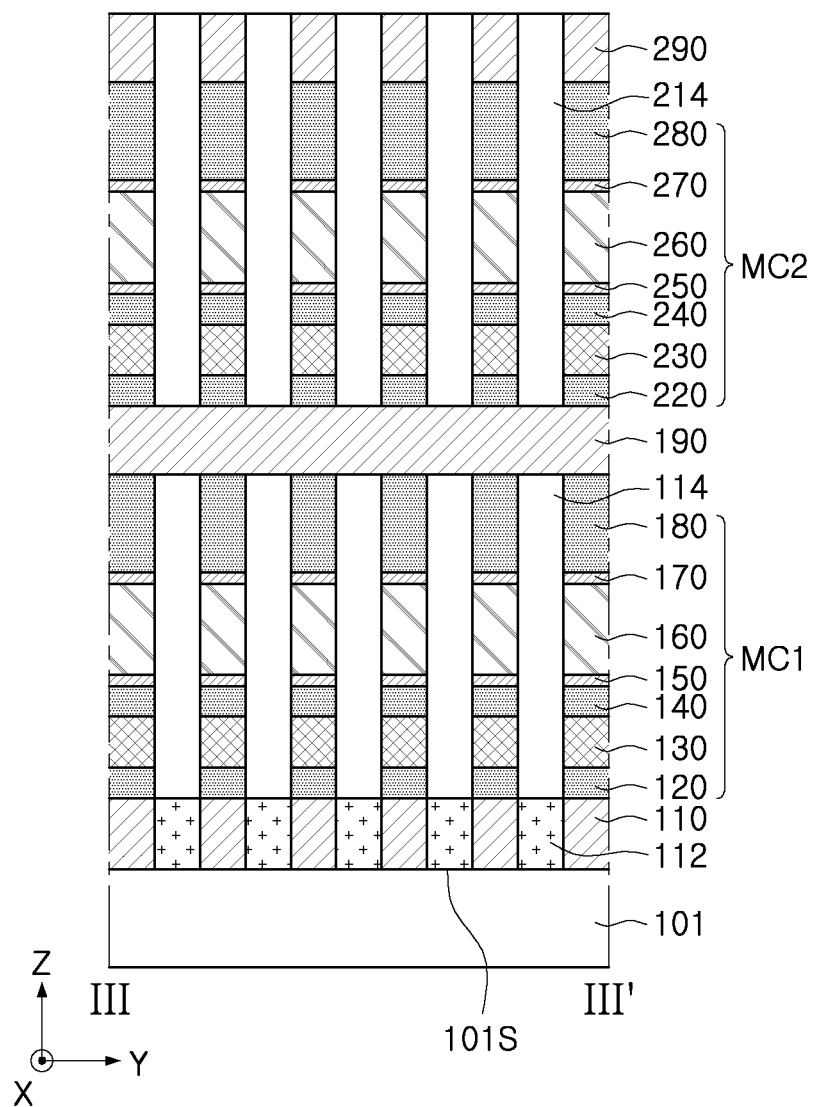

FIGS. 7A, 7B and 7C are cross-sectional views illustrating a semiconductor device according to an exemplary embodiment of the present inventive concept.

Referring to FIGS. 7A, 7B and 7C, semiconductor devices may include first conductive patterns 110 on a substrate 101, second conductive patterns 190 on the first conductive patterns 110, third conductive patterns 290 on the second conductive structure 190, a first memory cell structure MC1 between the first and second conductive patterns 110 and 190, and a second memory cell structure MC2 between the second and third conductive patterns 190 and 290. In an exemplary embodiment of the present inventive concept, one of the first conductive pattern 110 and the second conductive pattern 190 may be a word line, the other of the first conductive patterns 110 and the second conductive patterns 190 may be a bit line. When the second conductive pattern 190 is a bit line, the third conductive pattern 290 may be a word line.

Referring to FIG. 7A, a semiconductor device 200a may include a first insulating pattern 112 between the first conductive patterns 110, a second insulating pattern 114 at least partially surrounding the first memory cell structure MC1 (shown in FIG. 7C), and a third insulating pattern 214 at least partially surrounding the second memory cell structure MC2 (shown in FIG. 7C). The first insulating pattern 112 may include a first recess portion R1a and a second recess portion R2a in a region in which the first conductive patterns 110 and the second conductive patterns 190 do not overlap.

The semiconductor device 200a may further include a lower vertical structure VSa1 passing through the second insulating pattern 114 on the first insulating pattern 112. A lower portion of the lower vertical structure VSa1 may be disposed in the first recess portion R1a, and the lower vertical structure VSa1 may extend in the third direction (e.g., the z direction) to side surfaces of the second conductive patterns 190.

The semiconductor device 200a may further include an upper vertical structure VSa2 passing through the third insulating pattern 214 and disposed on the lower vertical structure VSa1. The upper vertical structure VSa2 may pass through a lower end of the third insulating pattern 214 to form a recess in an upper region of the second insulating pattern 114.

Referring to FIG. 7B, a semiconductor device 200b according to an exemplary embodiment of the present inventive concept may include a first insulating pattern 112 between the first conductive patterns 110, a second insulating pattern 114 at least partially surrounding the first memory cell structure MC1 (shown in FIG. 7C), and a third insulating pattern 214 at least partially surrounding the second memory cell structure MC2 (shown in FIG. 7C). The first insulating pattern 12 may include a first lower recess portion R1e and a second lower recess portion R2e in a region in which the first conductive patterns 110 and the second conductive patterns 190 do not overlap.

The semiconductor device 200b may further include a lower vertical structure VSb1 passing through the second insulating pattern 14 on the first insulating pattern 112. A lower portion of the lower vertical structure VSb1 may be disposed in the first lower recess portion R1e, and the lower vertical structure VSb1 may extend in the third direction (e.g., the z direction) to side surfaces of the second conductive patterns 190.

The semiconductor device 200b may further include an upper vertical structure VSb2 passing through the third insulating pattern 214 and contacting the lower vertical structure VSb1. The upper vertical structure VSb2 may pass through a lower end of the third insulating pattern 214 to form a first upper recess portion R1f in an upper portion of the second insulating pattern 114. A width of the first upper recess portion Rif in the first direction (e.g., the x direction) may be smaller than a width of the first upper recess portion R If in the second direction (e.g., the y direction).

In an exemplary embodiment of the present inventive concept, a second upper recess portion R2f may be disposed in an upper portion of the lower vertical structure VSb1. A width of the second upper recess portion R2f in the first direction (e.g., the x direction) may be greater than a width of the second upper recess portion R2f in the second direction (e.g., the y direction). An upper end of the second upper recess portion R2f may be adjacent to the side surfaces of the second conductive patterns 190. A maximum width of the second upper recess portion R2f in the first direction (e.g., the x direction) may be substantially equal to a distance between the second conductive patterns 190.

Referring to FIG. 7C, as described above, the substrate 101, the first conductive patterns 110 on the substrate 101, the first memory cell structure MC1 on the first conductive patterns 110, the second conductive patterns 190 on the first memory cell structure MC1, the second memory cell structure MC2 on the second conductive patterns 190, and the third conductive patterns 290 on the second memory cell structure MC2 may be arranged.

The first memory cell structure MC1 may include a first lower conductive pattern 120 on the first conductive patterns 110, a first switching material pattern 130 on the first lower conductive pattern 120, a first middle conductive pattern 140 on the first switching material pattern 130, a first lower electrode pattern 150 on the first middle conductive pattern 140, a first data storage material pattern 160 on the first lower electrode pattern 150, a first upper electrode pattern 170 on the first data storage material pattern 160, and a first upper conductive pattern 180 on the first upper electrode pattern 170. A second insulating pattern 14 at least partially surrounding the first memory cell structure MC1 may be disposed.

The second memory cell structure MC2 may include a second lower conductive pattern 220 on the second conductive patterns 190, a second switching material pattern 230 on the second lower conductive pattern 220, a second middle conductive pattern 240 on the second switching material pattern 230, a second lower electrode pattern 250 on the second middle conductive pattern 240, a second data storage material pattern 260 on the second lower electrode pattern 250, a second upper electrode pattern 270 on the second data storage material pattern 260, and a second upper conductive pattern 280 on the second upper electrode pattern 270. A third insulating pattern 214 at least partially surrounding the second memory cell structure MC2 may be disposed. The third insulating pattern 214 may extend in the third direction (e.g., the z direction) to side surfaces of the third conductive patterns 290.

Next, a method of manufacturing a semiconductor device according to an exemplary embodiment of the present inventive concept will be described with reference to FIGS. 8A, 8B, 9A, 9B, 10A, 10B, 11A, 11B, 12A, 12B, 13A and 13B. FIGS. 8A, 8B, 9A, 9B, 10A, 10B, 11A, 11B, 12A, 12B, 13A and 13B are cross-sectional views illustrating steps in a method of manufacturing a semiconductor device according to an exemplary embodiment of the present inventive concept.

Figure 8A:
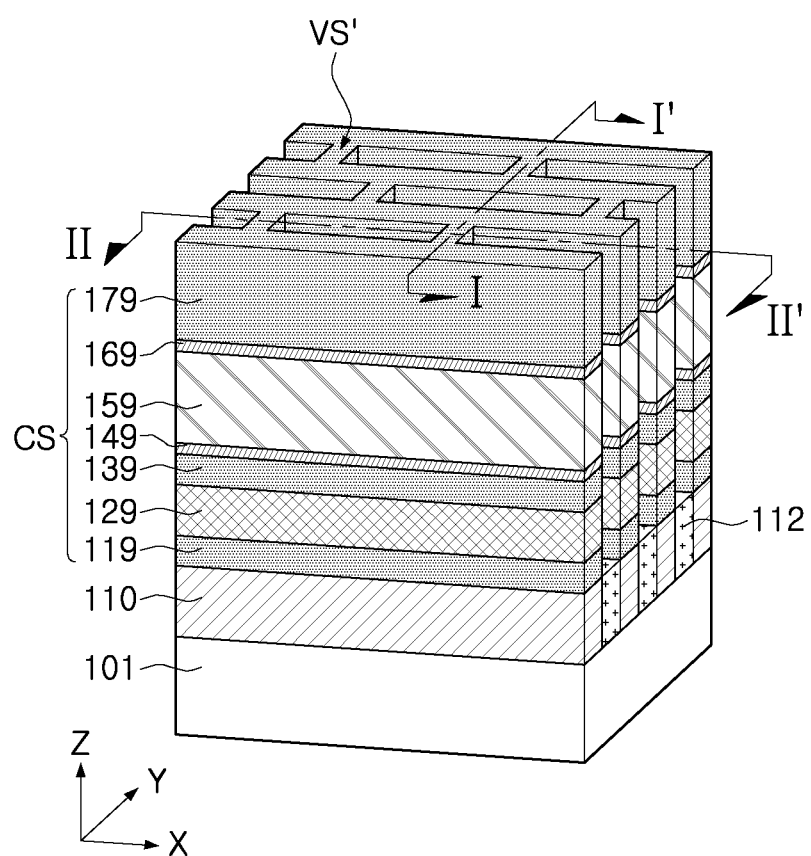
FIGS. 8A, 8B, 9A, 9B, 10A, 10B, 11A, 11B, 12A, 12B, 13A and 13B are cross-sectional views illustrating steps in a method of manufacturing a semiconductor device according to an exemplary embodiment of the present inventive concept.
Figure 8B:
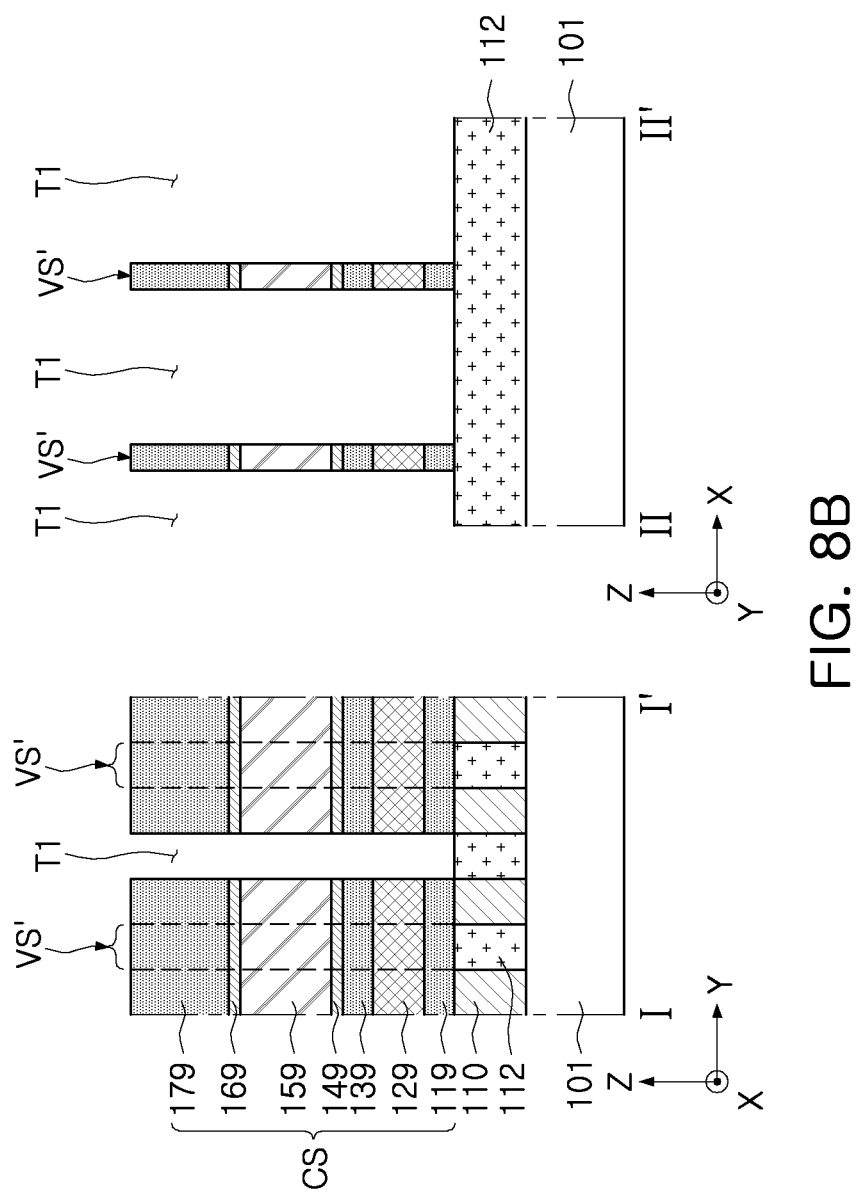

FIG. 8A is a perspective view illustrating a method of manufacturing a semiconductor device according to an exemplary embodiment of the present inventive concept, and FIG. 8B is a cross-sectional view illustrating a cross-section taken along cross-sectional line I-I' of FIG. 8A and a cross-section taken along cross-sectional line I-I' of FIG. 8A.

Referring to FIGS. 8A and 8B, a substrate 101 may be prepared. First conductive patterns 110 and first insulating patterns 112 disposed between the first conductive patterns 110 may be formed on the substrate 101.

A stack structure CS may be formed on the first conductive patterns 110 and the first insulating pattern 112. The stack structure CS may include line portions, and a preliminary vertical structure VS' between the line portions. For example, the preliminary vertical structure VS' may extend in the second direction (e.g., the y direction) between parallel stack structures CS. The line portions of the stack structure CS may include a lower conductive line 119, a switching material line 129, a middle conductive line 139, a lower electrode line 149, a data storage material line 159, an upper electrode line 169, and an upper conductive line 179, arranged on the first conductive patterns 110. Spaces between the line portions 119, 129, 139, 149, 159, 169, and 179 of the stack structure CS may be defined as a first trench T1. The first trench T1 may extend in a third direction (e.g., the z direction) and expose an upper surface of the first insulating pattern 12. The preliminary vertical structure VS' may have the same structure as a stacked structure of the stack structure CS (e.g., include line portions). The first trenches T1 may have a staggered arrangement in a plan view and may be aligned with a neighboring first trench T1 in the first direction (e.g., the x direction) but may not be aligned with a neighboring first trench T1 in the second direction (e.g., the y direction).

The preliminary vertical structure VS' of the stack structure CS may extend from side surfaces of at least one of the line portions 119, 129, 139, 149, 159, 169, and 179 of the stack structure CS. The preliminary vertical structure VS' of the stack structure CS may prevent collapse or deformation of the line portions 119, 129, 139, 149, 159, 169, and 179 of the stack structure CS.

The preliminary vertical structure VS' may have different widths in the first direction (e.g., the x direction) and the second direction (e.g., the y direction). When the preliminary vertical structure VS' is cut to be parallel to an upper surface of the substrate 101, a cross-section thereof may have a tetragonal shape or a rectangular shape, and in an exemplary embodiment of the present inventive concept, the preliminary vertical structure VS' may have a concave lens shape having a concave shape in the middle thereof, but the present inventive concept is not limited thereto. The shape of the cross-section of the preliminary vertical structure VS' may be variously changed.

During an acid or an alkali cleaning operation, after forming the stack structure CS, there may be defects in which the line portions 119, 129, 139, 149, 159, 169, and 179 of the stack structure CS may be inclined, may be in contact with each other, or may be collapsed. These defects may be caused due to surface tension of a solution such as isopropyl alcohol (PA), pure water (e.g., deionized water), or the like, which may be used for performing cleaning in the first trench T1 during the cleaning operation. Since the present inventive concept includes the preliminary vertical structure VS' capable of supporting the line portions 119, 129, 139, 149, 159, 169, and 179 of the stack structure CS, the above defects such as collapse or the like may be prevented.

In an exemplary embodiment of the present inventive concept, a plurality of spacers may be further formed to cover side surfaces of the stack structure CS. The plurality of spacers may prevent damage to the stack structure CS by residues of a metal layer that may remain during an etching or cleaning operation.

In an exemplary embodiment of the present inventive concept, the preliminary vertical structure VS' may be omitted. Therefore, the stack structure CS may be configured using the line portions 119, 129, 139, 149, 159, 169, and 179.

Figure 9A:
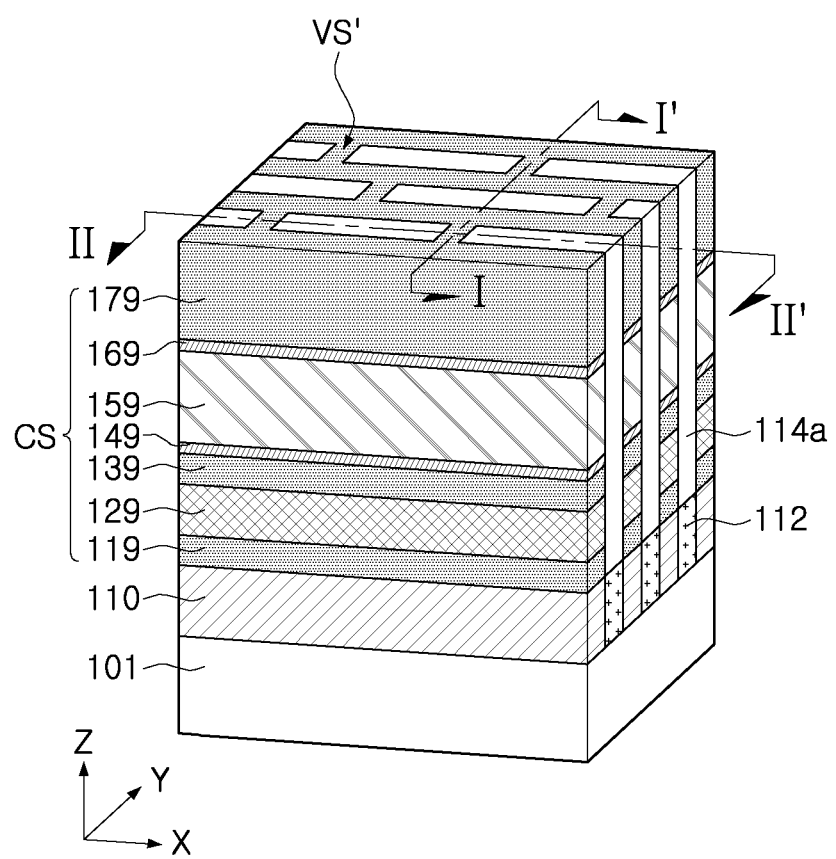
Figure 9B:
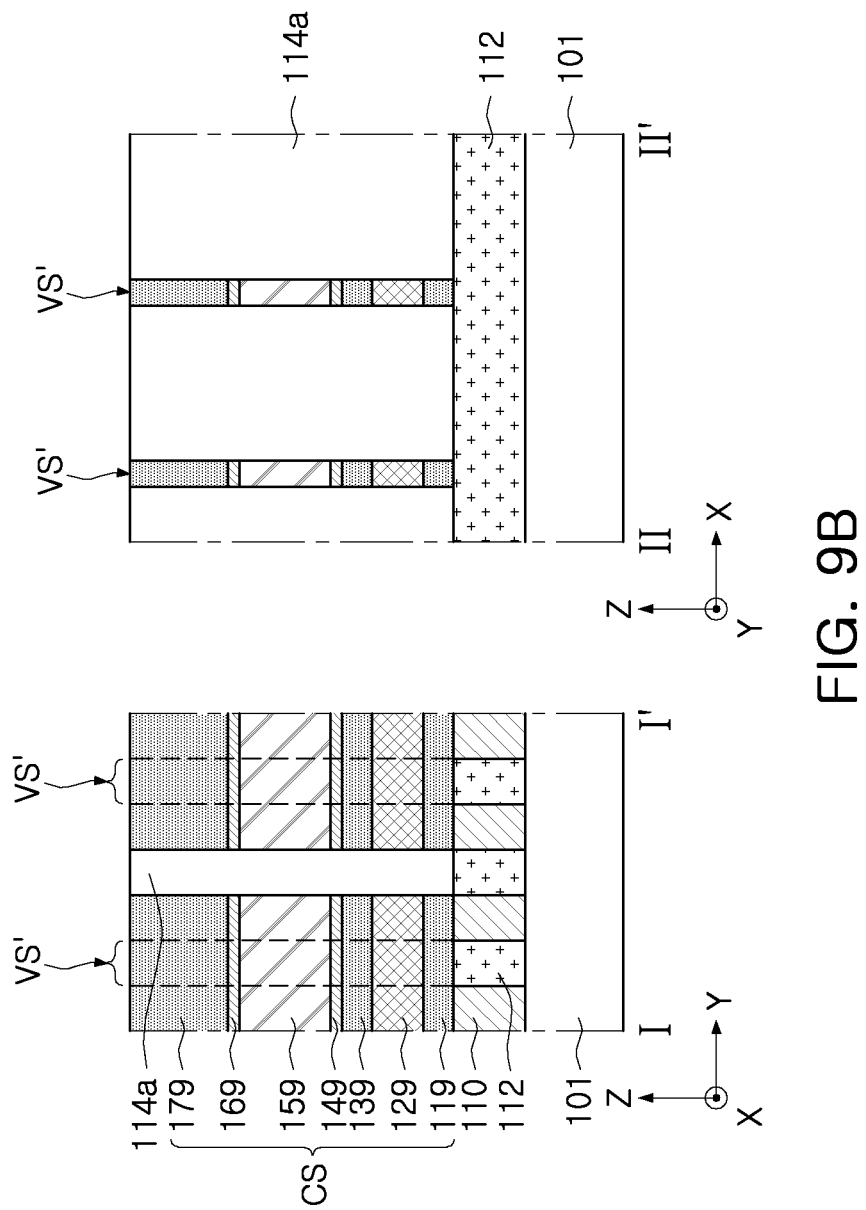

FIG. 9A is a perspective view illustrating a method of manufacturing a semiconductor device according to an exemplary embodiment of the present inventive concept, and FIG. 9B is a cross-sectional view illustrating a cross-section taken along cross-sectional line I-I' of FIG. 9A and a cross-section taken along cross-sectional line I-I' of FIG. 9A.

Referring to FIGS. 9A and 9B, a second preliminary insulating line 114a may be formed in the first trench T1. The second preliminary insulating line 114a may be formed of an insulating material such as silicon oxide and/or silicon nitride.

The formation of the second preliminary insulating line 114a may include forming an insulating material covering an upper surface of the upper conductive line 179 while filling an inside of the first trench T1, and planarizing the insulating material until the upper surface of the upper conductive line 179 and an upper surface of the preliminary vertical structure VS' are exposed. The insulating material may be planarized using a chemical mechanical polishing (CMP) process. An upper surface of the second preliminary insulating line 114a may be substantially coplanar with the upper surface of the upper conductive line 179.

Figure 10A:
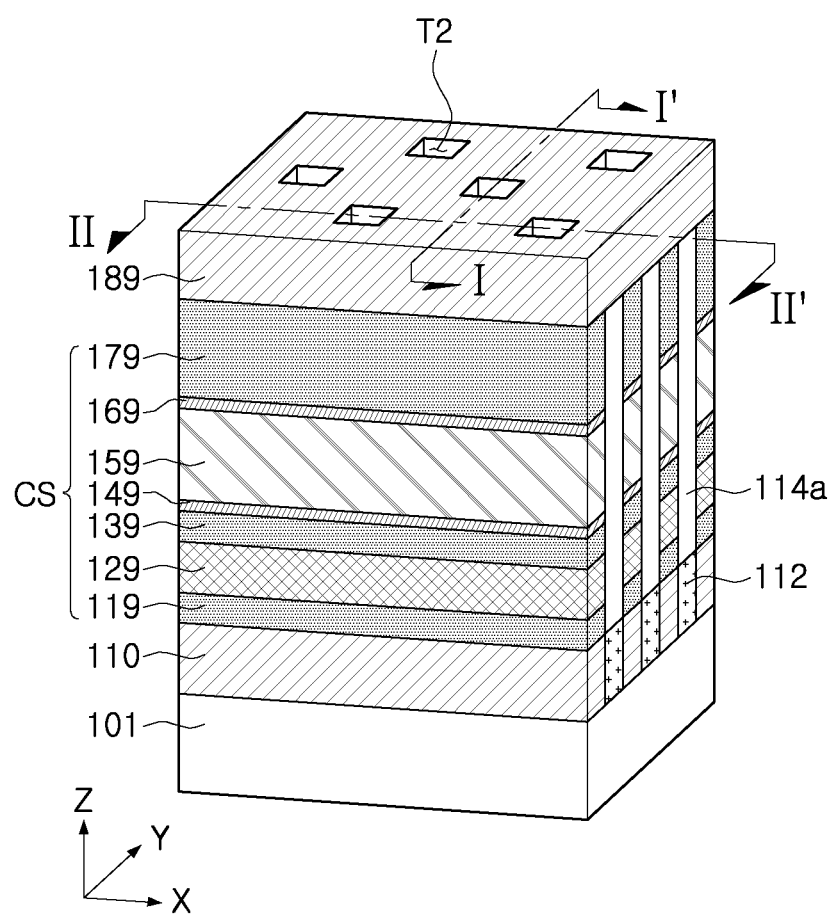
Figure 10B:
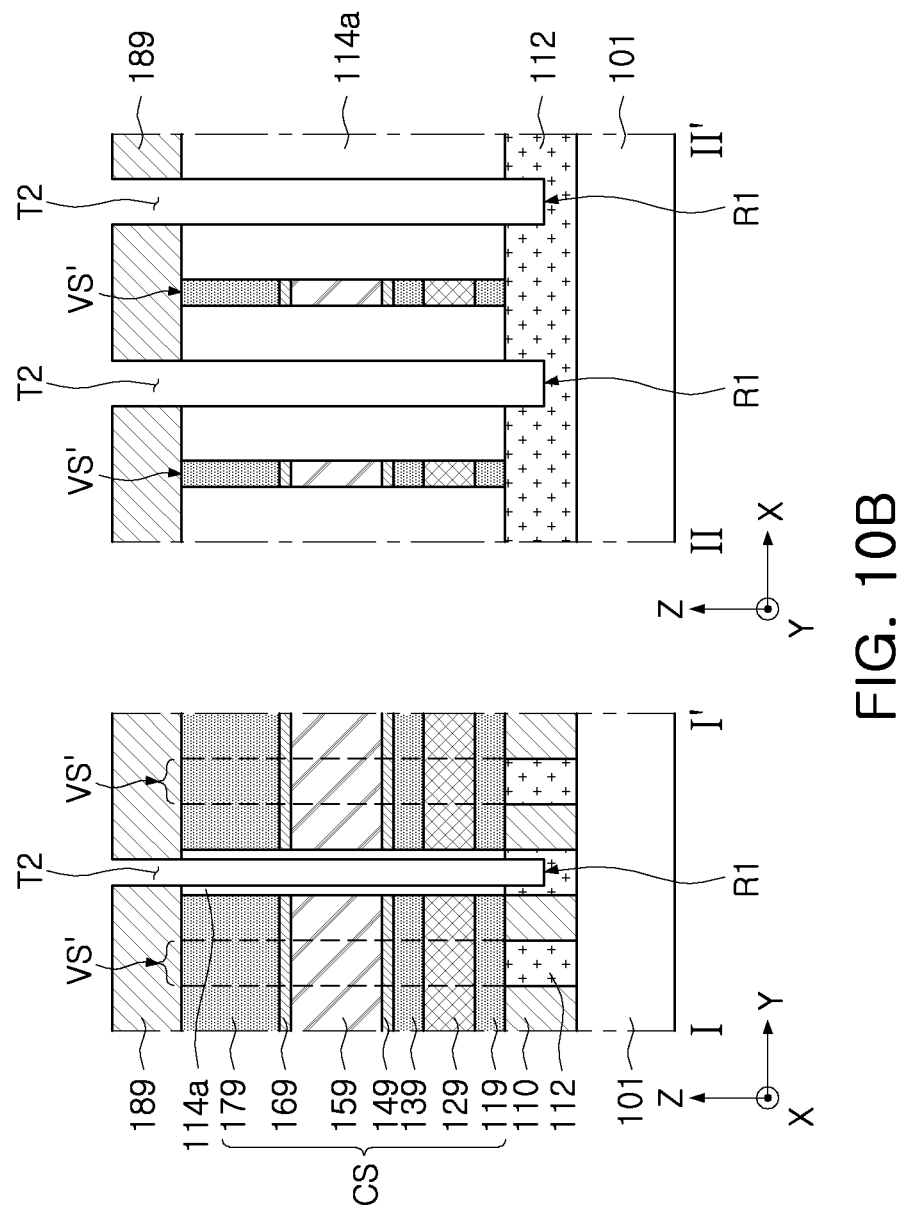

FIG. 10A is a perspective view illustrating a method of manufacturing a semiconductor device according to an exemplary embodiment of the present inventive concept, and FIG. 10B is a cross-sectional view illustrating a cross-section taken along cross-sectional line I-I' of FIG. 10A and a cross-section taken along cross-sectional line II-II' of FIG. 10A.

Referring to FIGS. 10A and 10B, a second preliminary conductive layer 189 parallel to an upper surface of the substrate 101 may be formed on the stack structure CS. The second preliminary conductive layer 189 may cover the upper conductive line 179, the preliminary vertical structure VS', and the second preliminary insulating line 114a.

Next, a second trench T2 passing through the second preliminary conductive layer 189 and the second preliminary insulating line 114a, and forming a first recess portion R1 in the first insulating pattern 112 may be formed by using a photolithography process and an etching process. The second preliminary conductive layer 189 passed partially through by the second trench T2 may form a second preliminary conductive structure 189. The second trench T2 may be disposed between the stack structures CS, and may be disposed between the preliminary vertical structures VS'.

In an exemplary embodiment of the present inventive concept, a second trench T2 may be formed at a position in which the preliminary vertical structure VS' is disposed. The second trench T2 may overlap the preliminary vertical structure VS', and may pass through the preliminary vertical structure VS' to form a first recess portion R1 below the preliminary vertical structure VS' (shown in FIG. 10B).

In an exemplary embodiment of the present inventive concept, a second trench T2 may be formed before forming the second preliminary conductive layer 189. For example, referring to FIG. 9A, a second trench T2 passing through the second preliminary insulating line 114a and forming a first recess portion R1 in the first insulating pattern 112 may be formed. In this case, the second trench T2 may be filled with an insulating material in a deposition process to be described later, to form a vertical structure VS (shown in FIG. 11A). Then, a second preliminary conductive layer 189 covering the upper conductive line 179 and the vertical structure VS may be formed.

Figure 11A:
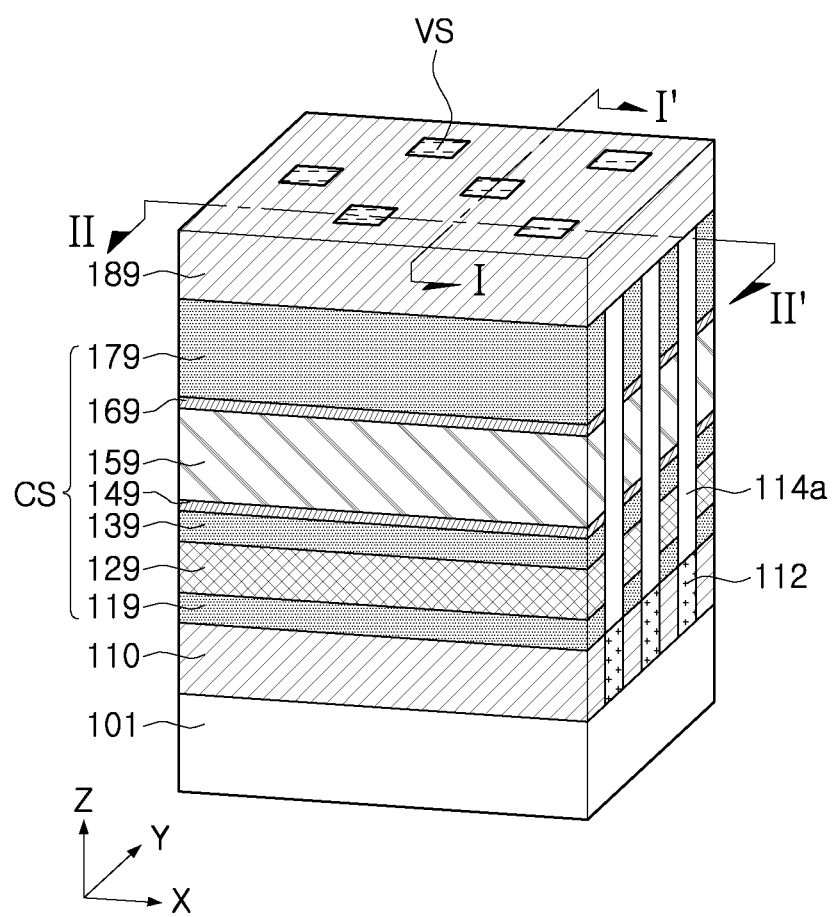
Figure 11B:
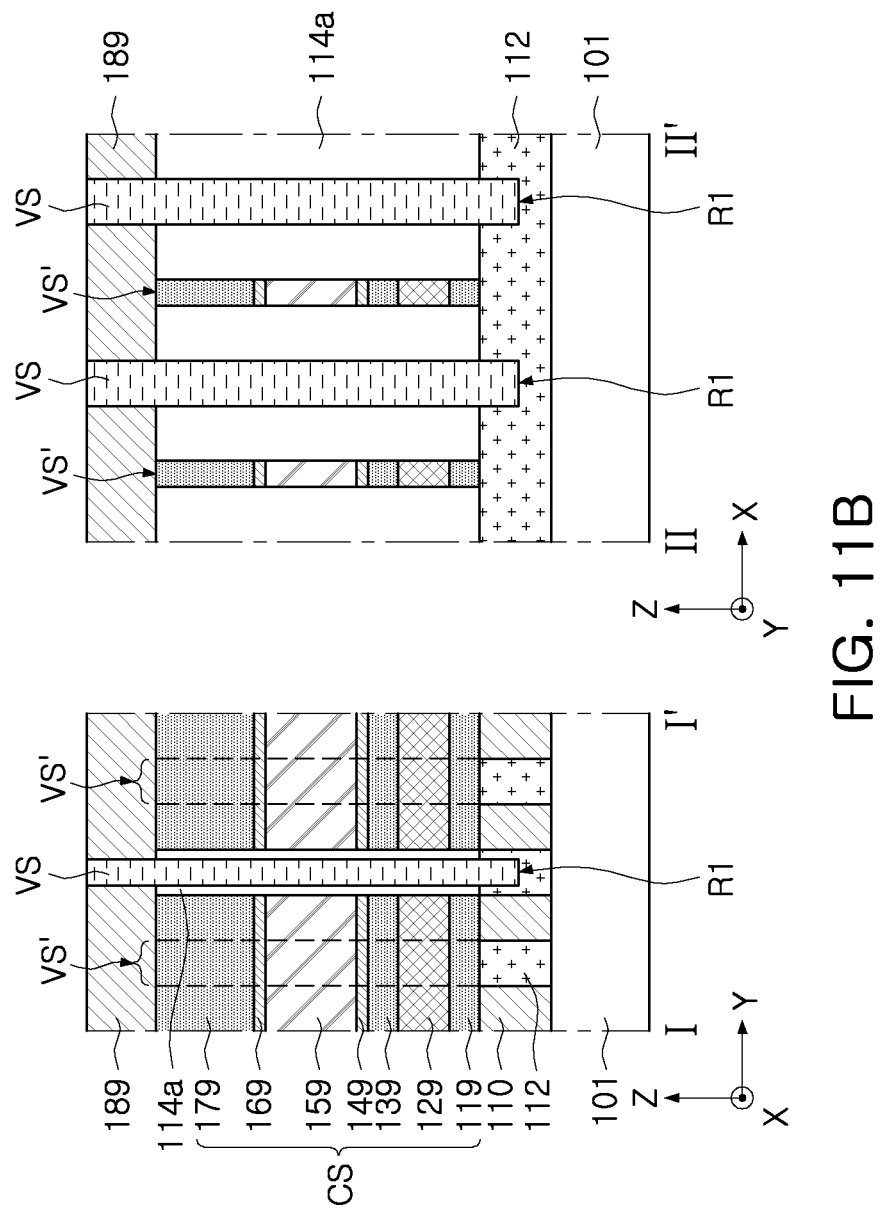

FIG. 11A is a perspective view illustrating a method of manufacturing a semiconductor device according to an exemplary embodiment of the present inventive concept, and FIG. 11B is a cross-sectional view illustrating a cross-section taken along cross-sectional line I-I' of FIG. 11A and a cross-section taken along cross-sectional line II-II' of FIG. 11A.

Referring to FIGS. 11A and 11B, a vertical structure VS may be formed in a second trench T2. The formation of the vertical structure VS may include forming an insulating material to cover an upper surface of the second preliminary conductive structure 189 while filling the second trench T2, and planarizing the insulating material until the upper surface of the second preliminary conductive structure 189 and an upper surface of the vertical structure VS are exposed. The insulating material may be planarized using a chemical mechanical polishing (CMP) process. An upper surface of the vertical structure VS may be substantially coplanar with the upper surface of the second preliminary conductive structure 189.

A lower portion of the vertical structure VS may be disposed in the first recess portion R1. The second preliminary insulating line 114a may be disposed on a side surface of the vertical structure VS. For example, the second preliminary insulating line 114a may be disposed between vertical sidewalls of the preliminary vertical structure VS' and the vertical structure VS.

Figure 12A:
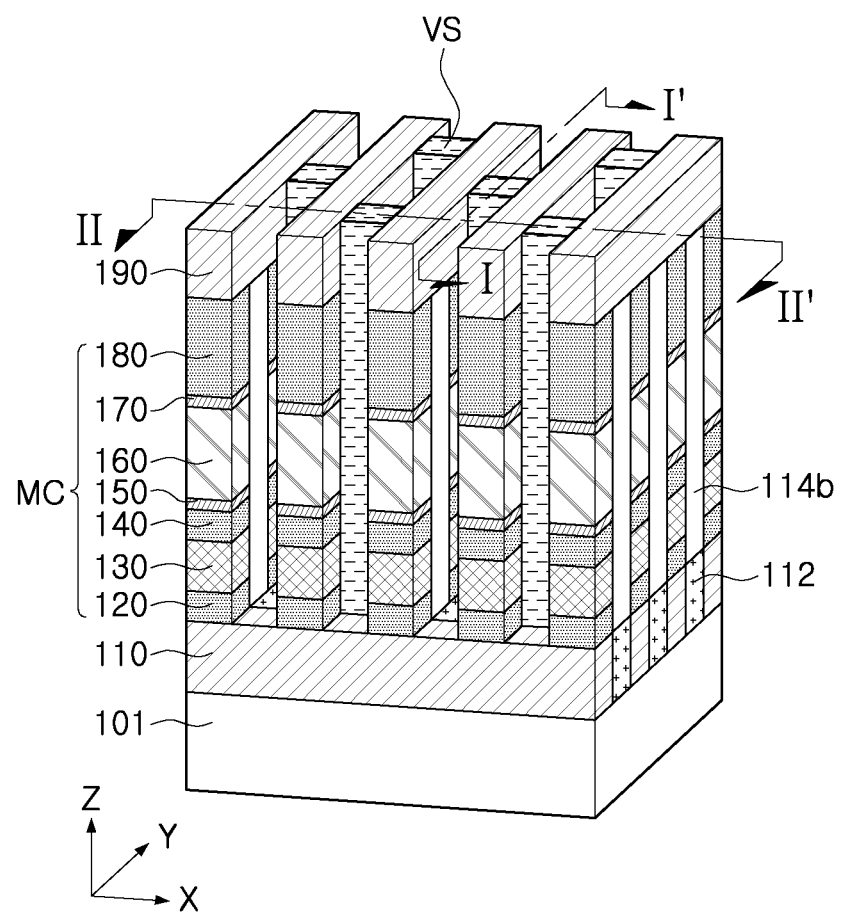
Figure 12B:
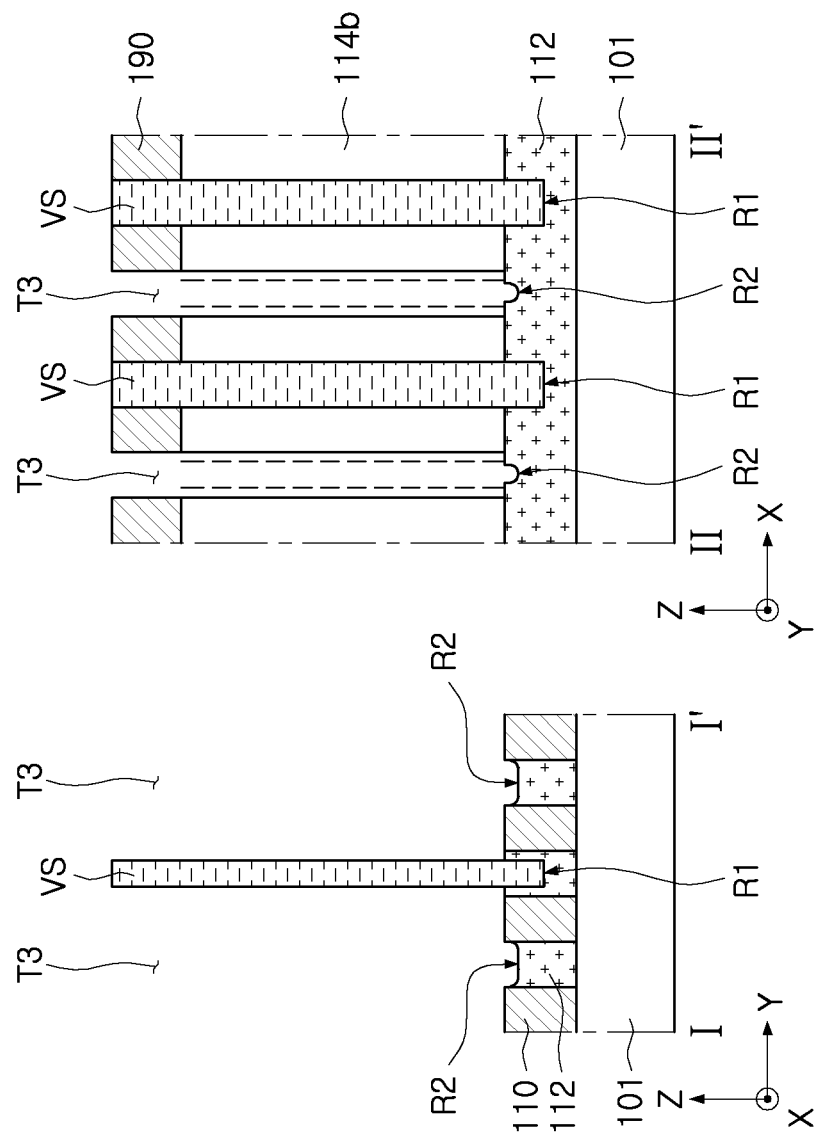

FIG. 12A is a perspective view illustrating a method of manufacturing a semiconductor device according to an exemplary embodiment of the present inventive concept, and FIG. 12B is a cross-sectional view illustrating a cross-section taken along cross-sectional line I-I' of FIG. 12A and a cross-section taken along cross-sectional line I-II' of FIG. 12A.

Referring to FIGS. 12A and 12B, a portion of the stack structure CS may be etched to form a memory cell structure MC. A portion of the second preliminary conductive structure 189 may be etched to form a second conductive pattern 190. The memory cell structure MC may include a lower conductive pattern 120, a switching material pattern 130, a middle conductive pattern 140, a lower electrode pattern 150, a data storage material pattern 160, an upper electrode pattern 170, and an upper conductive pattern 180, arranged on the first conductive patterns 110. A second preliminary insulating pattern 114b extending from the first insulating pattern 112 in the third direction (e.g., the z direction) toward the second conductive patterns 190 may be formed between the memory cell structures MC. Space between the memory cell structures MC and between the second preliminary insulating patterns 114b may be defined as a third trench T3. The vertical structure VS may not be removed, when the portion of the stack structure CS is etched. The vertical structure VS may prevent collapse or deformation of the memory cell structure MC.

The vertical structure VS may have different widths in the first direction (e.g., the x direction) and the second direction (e.g., the y direction). When the vertical structure VS is cut to be parallel to an upper surface of the substrate 101, a cross-section thereof may have a tetragonal shape or a rectangular shape, but the present inventive concept is not limited thereto. The shape of the cross-section of the vertical structure VS may be variously changed according to an exemplary embodiment of the present inventive concept.

During an acid or an alkali cleaning operation, after forming the memory cell structure MC, there may be defects in which the memory cell structure MC may be inclined, may be in contact with each other, or may be collapsed. The defects may be due to surface tension of a solution such as isopropyl alcohol (IPA), pure water (e.g., deionized water), or the like, which may be used for cleaning in the third trench T3 during the cleaning operation. Since the present inventive concept includes the vertical structure VS capable of supporting the memory cell structure MC, the above defects such as collapse or the like may be prevented.

A material forming the stacking structure CS and the preliminary vertical structure VS' (see FIGS. 11A and 11B) may have a faster etching rate than a material forming the second preliminary insulating line 114a. When the second preliminary insulating pattern 114b is formed, all of the preliminary vertical structure VS' may be etched to form a second recess portion R2 in the first insulating pattern 12 below the preliminary vertical structure VS', while being etched to a lower end of the second preliminary insulating line 114a. The second recess portion R2 may have different width and/or shape, depending on a shape of the cross-section of the preliminary vertical structure VS'. For example, since a width of the preliminary vertical structure VS' in the first direction (e.g., the x direction) is smaller than a width of the preliminary vertical structure VS' in the second direction (e.g., the y direction), a width of the second recess portion R2 in the first direction (e.g., the x direction) may be smaller than a width of the second recess portion R2 in the second direction (e.g., the y direction).

Figure 13A:
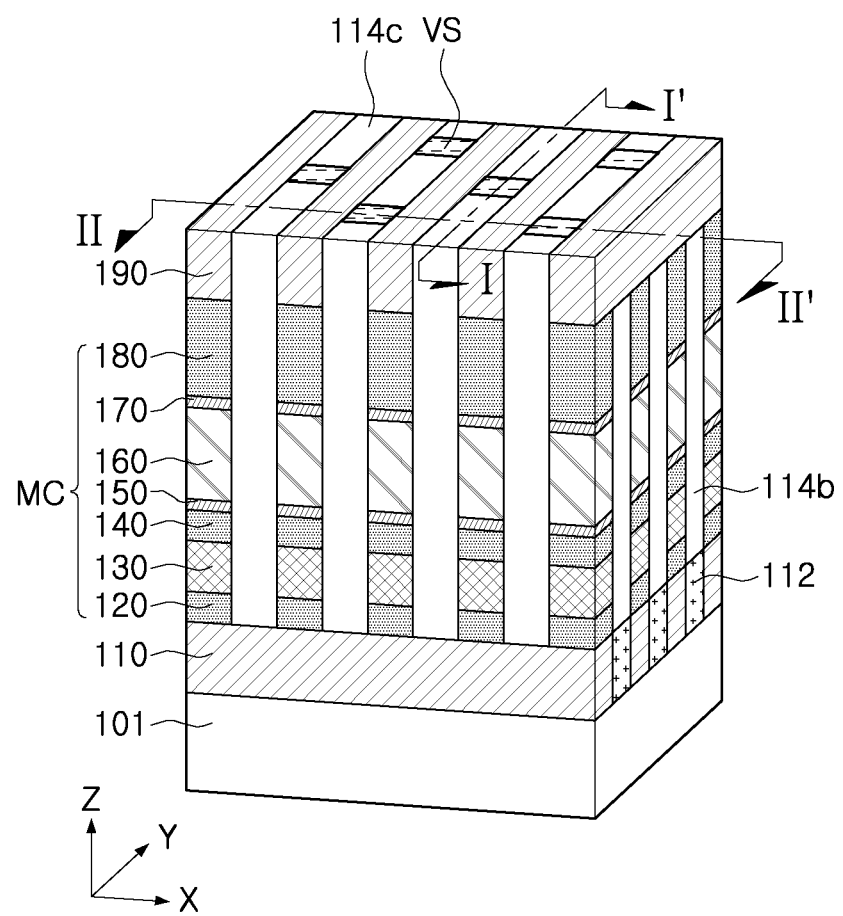
Figure 13B:
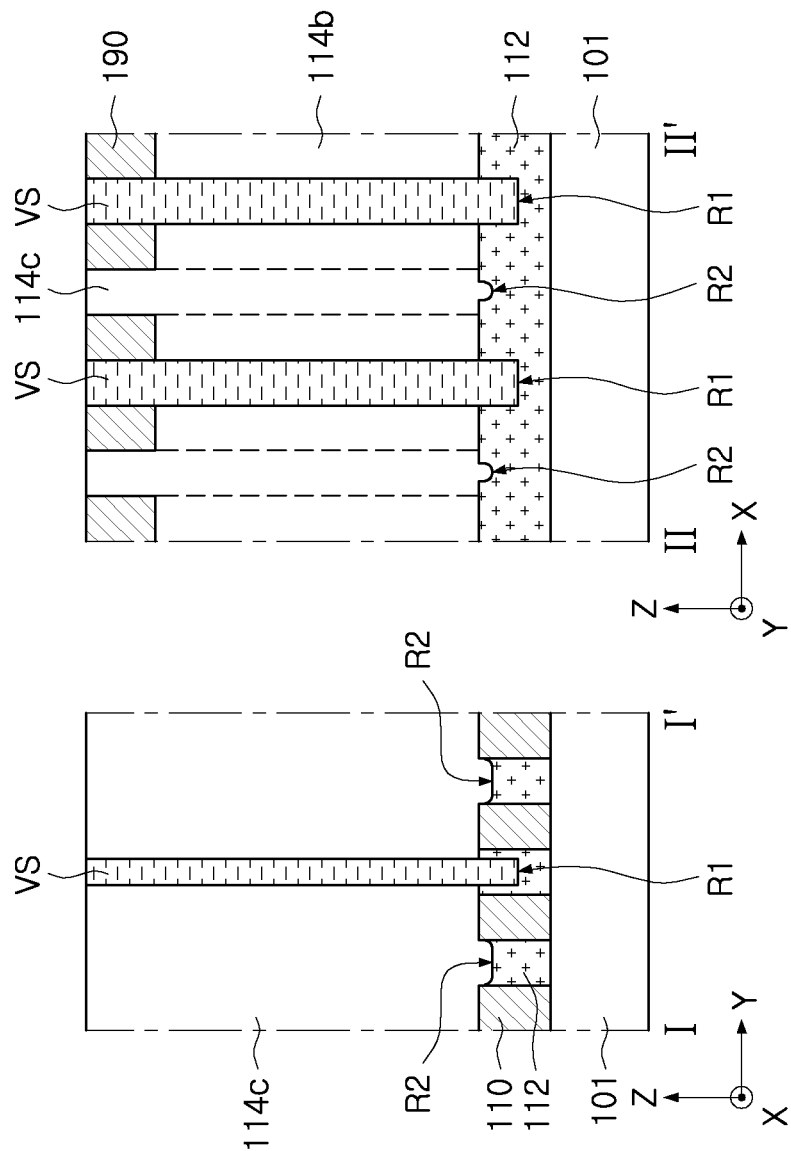

FIG. 13A is a perspective view illustrating a method of manufacturing a semiconductor device according to an exemplary embodiment of the present inventive concept, and FIG. 13B is a cross-sectional view illustrating a cross-section taken along cross-sectional line I-I' of FIG. 13A and a cross-section taken along cross-sectional line II-II' of FIG. 13A.

Referring to FIGS. 13A and 13B, a second insulating line 114c may be formed in the third trench T3. An insulating material of the second insulating line 114c may fill the third trench T3 and cover upper surfaces of the second conductive patterns 190. The insulating material of the second insulating line 114c may be planarized until the upper surfaces of the second conductive patterns 190 are exposed. The insulating material may be planarized using a chemical mechanical polishing (CMP) process. An upper surface of the second insulating line 114c may be substantially coplanar with the upper surfaces of the second conductive patterns 190. The second insulating line 114c and the second preliminary insulating pattern 114b may include the same material, and may be collectively referred to as a second insulating pattern in the present inventive concept.

According to an exemplary embodiment of the present inventive concept, since a semiconductor device includes vertical structures serving as a support, structural weaknesses of memory cell structures may be increased. Therefore, a semiconductor device having increased reliability and integration may be provided.

While exemplary embodiments of the present inventive concept have been illustrated and described above, it will be understood by those of ordinary skill in the art that various changes in form and details may be made therein without departing from the spirit and scope of the present inventive concept as defined by the appended claims.

What is claimed is:

1. A semiconductor device, comprising:
   a plurality of first conductive patterns disposed on a substrate;
   a first insulating pattern disposed between the plurality of first conductive patterns;
   a plurality of second conductive patterns disposed on the plurality of first conductive patterns;
   a first memory cell structure disposed between the plurality of first conductive patterns and the plurality of second conductive patterns and including a data storage material pattern including a phase change material;
   a second insulating pattern disposed on the first insulating pattern and on a side surface of the first memory cell structure; and
   a first vertical structure disposed on the first insulating pattern and passing through the second insulating pattern in a direction perpendicular to an upper surface of the substrate.

2. The semiconductor device of claim 1, wherein the first insulating pattern has a plurality of recess portions,
   wherein the plurality of recess portions include a first recess portion and a second recess portion, and
   wherein the first recess portion and the second recess portion have different depths.

3. The semiconductor device of claim 2, wherein the plurality of recess portions are disposed in regions in which the plurality of first conductive patterns and the plurality of second conductive patterns do not overlap each other.

4. The semiconductor device of claim 2, wherein a lower portion of the first vertical structure is disposed in the first recess portion.

5. The semiconductor device of claim 1, wherein the first vertical structure extends to side surfaces of the plurality of second conductive patterns.

6. The semiconductor device of claim 2, wherein a width of the second recess portion in a first direction is smaller than a width of the second recess portion in a second direction, and
   wherein the second direction is perpendicular to the first direction.

7. The semiconductor device of claim 1, wherein the first memory cell structure includes a lower conductive pattern disposed on the plurality of first conductive patterns, a switching material pattern disposed on the lower conductive pattern, a middle conductive pattern disposed on the switching material pattern, a lower electrode pattern disposed on the middle conductive pattern, the data storage material pattern disposed on the lower electrode pattern, an upper electrode pattern disposed on the data storage material pattern, and an upper conductive pattern disposed on the upper electrode pattern.

8. The semiconductor device of claim 2, further comprising:
   a second vertical structure disposed on the first insulating pattern and passing through the second insulating pattern,
   wherein a lower portion of the second vertical structure is disposed in the second recess portion.

9. The semiconductor device of claim 8, wherein an upper surface of the second vertical structure is lower than an upper surface of the first vertical structure.

10. The semiconductor device of claim 2, wherein at least one first recess portion and at least one second recess portions intersect and overlap each other, and
wherein the first vertical structure extends into the first insulating pattern in a lower portion of the second recess portion.

11. The semiconductor device of claim 1, wherein an upper surface of the first vertical structure is lower than a lower surface of the plurality of second conductive patterns.

12. The semiconductor device of claim 1, further comprising:
a plurality of third conductive patterns disposed on the plurality of second conductive patterns; and
a second memory cell structure between the plurality of second conductive patterns and the plurality of third conductive patterns.

13. A semiconductor device, comprising:
a plurality of first conductive patterns disposed on a substrate, the plurality of first conductive patterns extending in a first direction;
a memory cell structure disposed on the plurality of first conductive patterns, the memory cell structure including a switching material pattern and a data storage material pattern;
a plurality of second conductive patterns disposed on the memory cell structure, the plurality of second conductive patterns extending in a second direction, the second direction is perpendicular to the first direction;
a first insulating pattern repeatedly alternately disposed on the substrate with the plurality of first conductive patterns, the first insulating pattern extending in the first direction; and
a second insulating pattern at least partially surrounding the memory cell structure,
wherein the first insulating pattern includes a first recess portion and a second recess portion, and
wherein the first recess portion and the second recess portion have different widths.

14. The semiconductor device of claim 13, wherein the first and second recess portions are repeatedly alternately arranged in the first direction or the second direction.

15. The semiconductor device of claim 13, wherein a width of a central portion of the second recess portion in the first direction is smaller than a width of an end of the second recess portion, adjacent to the plurality of first conductive patterns, in the first direction.

16. The semiconductor device of claim 13, further comprising:

a first vertical structure disposed on the first recess portion and extending in a third direction,
wherein the third direction is a direction perpendicular to an upper surface of the substrate.

17. The semiconductor device of claim 16, further comprising:
a second vertical structure disposed on the second recess portion and extending in the third direction,
wherein an upper surface of the second vertical structure is lower than an upper surface of the first vertical structure.

18. The semiconductor device of claim 16, wherein the first recess portion and the second recess portion overlap in the third direction, and
wherein the first vertical structure passes through the second recess portion.

19. A semiconductor device, comprising:
a plurality of first conductive patterns disposed on a substrate, the plurality of first conductive patterns extending in a first direction;
a memory cell structure disposed on the plurality of first conductive patterns;
a plurality of second conductive patterns disposed on the memory cell structure, the plurality of second conductive patterns extending in a second direction, wherein the second direction is perpendicular to the first direction, and wherein the plurality of second conductive patterns intersect the plurality of first conductive patterns;
a first insulating pattern disposed between the plurality of first conductive patterns; and
a second insulating pattern at least partially surrounding a side surface of the memory cell structure,
wherein the first insulating pattern has a plurality of recess portions, and
wherein a center of each of the plurality of recess portions does not overlap the plurality of second conductive patterns.

20. The semiconductor device of claim 19, further comprising:
a plurality of vertical structures disposed on the first insulating pattern and passing through the second insulating pattern,
wherein lower ends of the plurality of vertical structures are disposed in first recess portions of the plurality of recess portions, and
wherein a depth of the first recess portions is deeper than a depth of second recess portions of the plurality of recess portions in which the plurality of vertical structures are not disposed.

* * * * *